United States Patent
Kim et al.

(10) Patent No.: US 12,161,051 B2
(45) Date of Patent: Dec. 3, 2024

(54) SPIN-ORBIT TORQUE (SOT)-BASED MAGNETIC TUNNEL JUNCTION AND METHOD OF FABRICATING THE SAME

(71) Applicant: Korea University Research and Business Foundation, Seoul (KR)

(72) Inventors: Young Keun Kim, Seoul (KR); Taehyun Kim, Seongnam-si (KR)

(73) Assignee: Korea University Research and Business Foundation, Seoul (KR)

( * ) Notice: Subject to any disclaimer, the term of this patent is extended or adjusted under 35 U.S.C. 154(b) by 439 days.

(21) Appl. No.: 17/488,609

(22) Filed: Sep. 29, 2021

(65) Prior Publication Data
US 2022/0165943 A1 May 26, 2022

(30) Foreign Application Priority Data
Nov. 20, 2020 (KR) .................. 10-2020-0156790
Aug. 9, 2021 (KR) .................. 10-2021-0104332

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *H01F 10/3286* (2013.01); *H10B 61/00* (2023.02); *H10N 50/01* (2023.02); *H10N 50/10* (2023.02); *H10N 50/85* (2023.02); *H10N 52/80* (2023.02)

(58) Field of Classification Search
None
See application file for complete search history.

(56) References Cited

U.S. PATENT DOCUMENTS 9,576,631 B2 * 2/2017 Buhrman ............... H10N 50/10
10,937,479 B1 * 3/2021 Beery ................... H10N 50/10
(Continued)

FOREIGN PATENT DOCUMENTS

CN   108336222 A    7/2018
CN   111952438 A    11/2020
(Continued)

OTHER PUBLICATIONS

Japanese Office Action issued on Dec. 21, 2022, in counterpart Japanese Patent Application No. 2021-187551 (6 pages in English, 6 pages in Japanese).
(Continued)

*Primary Examiner* — Kevin M Bernatz
(74) *Attorney, Agent, or Firm* — NSIP Law

(57) ABSTRACT

Disclosed are a spin-orbit torque (SOT)-based magnetic tunnel junction and a method of fabricating the same. More particularly, the SOT-based magnetic tunnel junction includes a spin-orbit torque (SOT)-based magnetic tunnel junction, including: a spin-orbit active layer formed on the substrate; a free layer formed on the spin-orbit active layer; a tunnel barrier layer formed on the free layer; and a pinned layer formed on the tunnel barrier layer, wherein the spin-orbit active layer includes a W—X alloy (where W is tungsten and X includes at least one of group IV semiconductors and group III-V semiconductors).

15 Claims, 35 Drawing Sheets

(51) Int. Cl.
*H01F 10/32* (2006.01)
*H10B 61/00* (2023.01)
*H10N 50/01* (2023.01)
*H10N 50/10* (2023.01)
*H10N 50/85* (2023.01)
*H10N 52/80* (2023.01)

(56) References Cited

U.S. PATENT DOCUMENTS

| | | | | |
|---|---|---|---|---|
| 2010/0003767 | A1* | 1/2010 | Cho | H10N 50/01 257/E21.001 |
| 2010/0096716 | A1* | 4/2010 | Ranjan | B82Y 25/00 257/E29.323 |
| 2014/0319634 | A1* | 10/2014 | Shukh | G11C 11/161 257/427 |
| 2015/0021675 | A1 | 1/2015 | Min | |
| 2015/0200003 | A1* | 7/2015 | Buhrman | G11C 11/18 365/158 |
| 2017/0062711 | A1* | 3/2017 | Saito | C30B 29/68 |
| 2017/0338021 | A1* | 11/2017 | Xiao | H01F 10/329 |
| 2018/0366638 | A1* | 12/2018 | Lin | H10B 61/22 |
| 2019/0305212 | A1* | 10/2019 | Gosavi | G11C 11/1675 |
| 2019/0362971 | A1* | 11/2019 | Wong | C01B 19/007 |
| 2020/0006626 | A1* | 1/2020 | Smith | H10B 61/22 |
| 2020/0105998 | A1* | 4/2020 | Smith | H10N 50/80 |
| 2020/0106002 | A1* | 4/2020 | Song | H01F 41/302 |
| 2020/0168664 | A1* | 5/2020 | Noh | H10N 52/80 |
| 2020/0227104 | A1* | 7/2020 | Rahman | H10B 61/22 |
| 2021/0119117 | A1* | 4/2021 | Kim | H10N 52/01 |
| 2021/0265562 | A1* | 8/2021 | Ichikawa | H01F 10/26 |
| 2021/0296575 | A1* | 9/2021 | Kim | H10B 61/00 |
| 2023/0276639 | A1* | 8/2023 | Pola | H10B 63/10 257/5 |

FOREIGN PATENT DOCUMENTS

| | | |
|---|---|---|
| JP | 6-120164 A | 4/1994 |
| JP | 2018-74139 A | 5/2018 |
| JP | 2018-98481 A | 6/2018 |
| KR | 10-1457511 B1 | 11/2014 |
| KR | 10-1738829 B1 | 5/2017 |
| KR | 10-2018-0007384 A | 1/2018 |
| KR | 10-1825318 B1 | 2/2018 |
| KR | 10-2019-0108686 A | 9/2019 |
| KR | 10-2020-0030277 A | 3/2020 |
| KR | 10-2020-0066648 A | 6/2020 |
| WO | WO 2019/140729 A1 | 7/2019 |

OTHER PUBLICATIONS

Fritz, Katharina et al., "Large Spin Hall Effect in an Amorphous Binary Alloy," American Physical Society, 2018, (8 Pages in English).

Korean Office Action Issued on Oct. 31, 2022, in counterpart of Korean Patent Application No. 10-2021-0104332 (6 Pages in Korean).

Chen, Wenzhe, et al. "Temperature Study of the Giant Spin Hall Effect in the Bulk Limit of β-W." *Physical Review B*, 98, 13, 2018 (pp. 1-8).

Extended European search report issued May 3, 2022, in counterpart European Patent Application No. 21205098.3 (7 pages in English).

Notification of European publication number issued May 4, 2022, in counterpart European Patent Application No. 21205098.3 (2 pages in English).

European Office Action Issued on Mar. 24, 2023, in Counterpart European Patent Application No. 21 205 098.3 (5 Pages in English).

* cited by examiner

[FIG. 1]
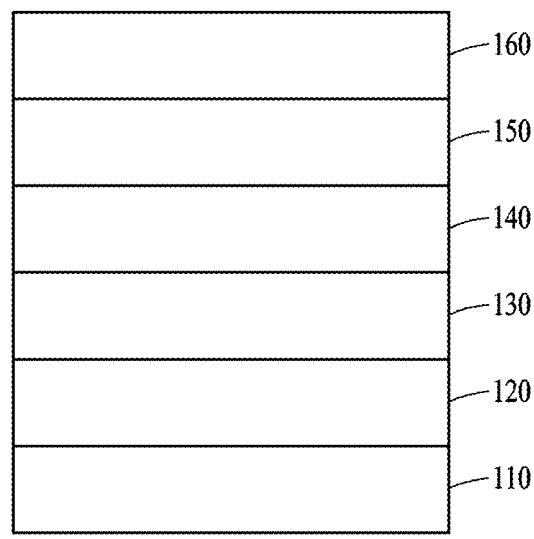
[FIG. 2]
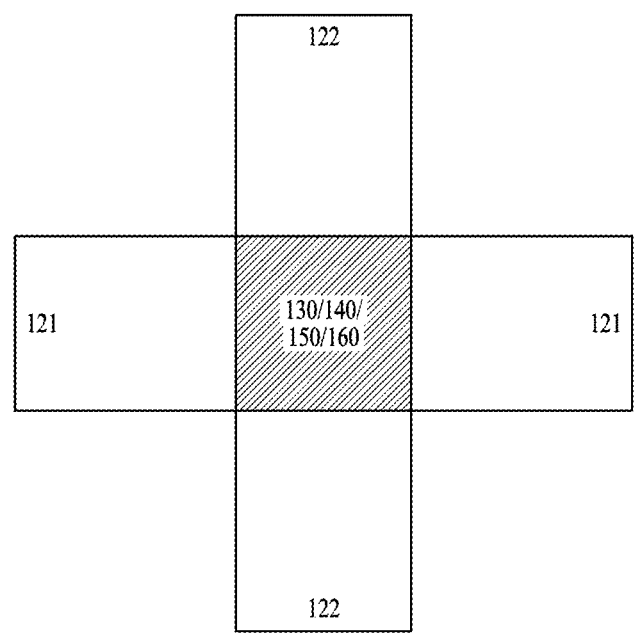

【FIG. 3】
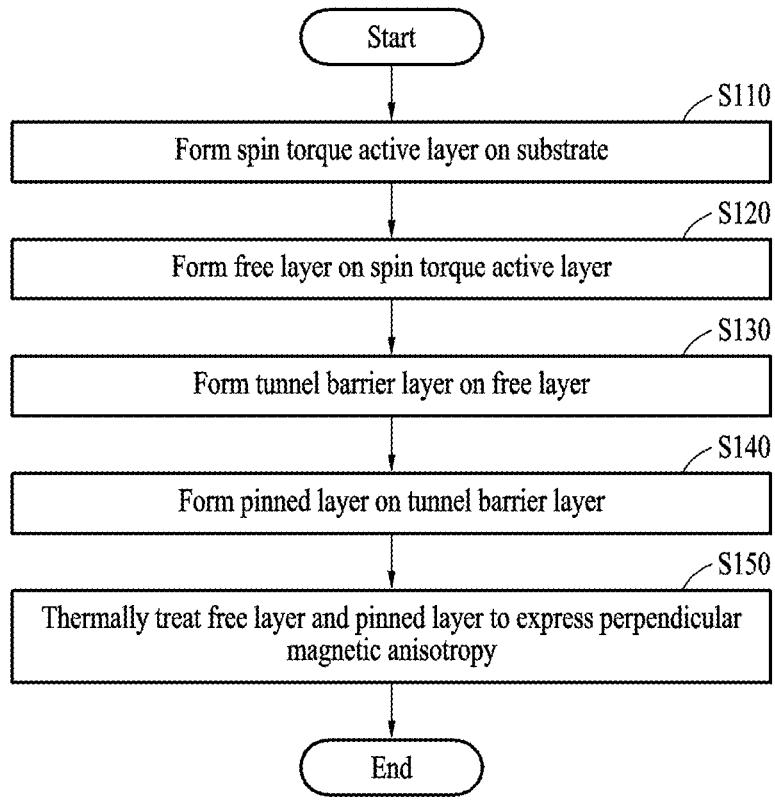
【FIG. 4】
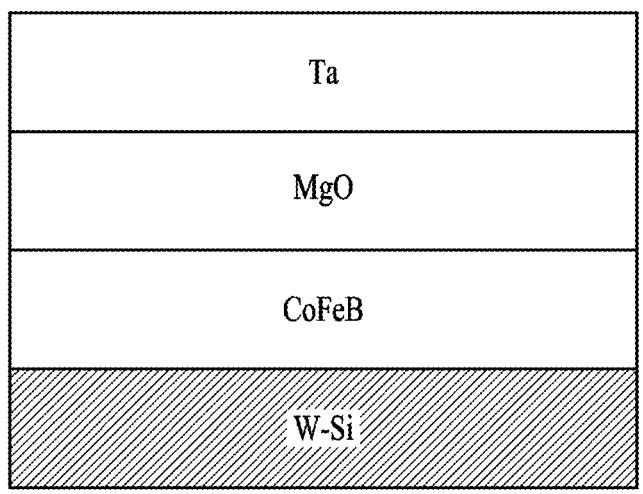

[FIG. 5]
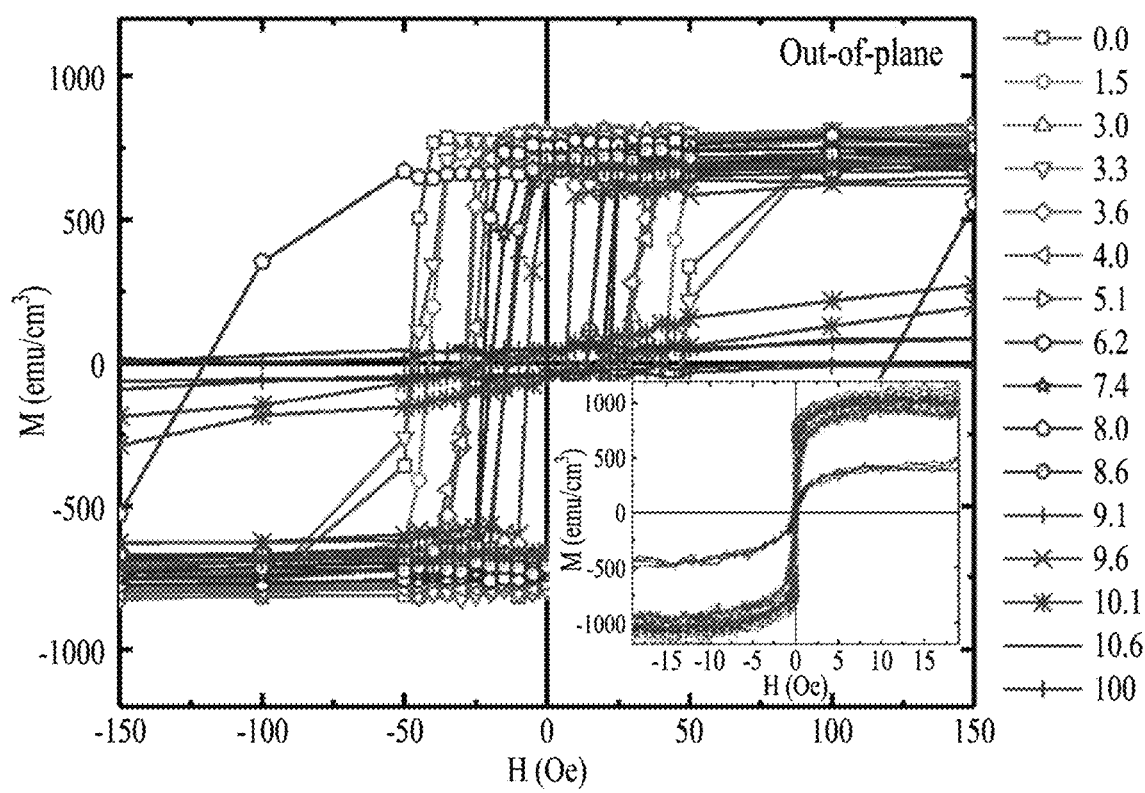

[FIG. 6]
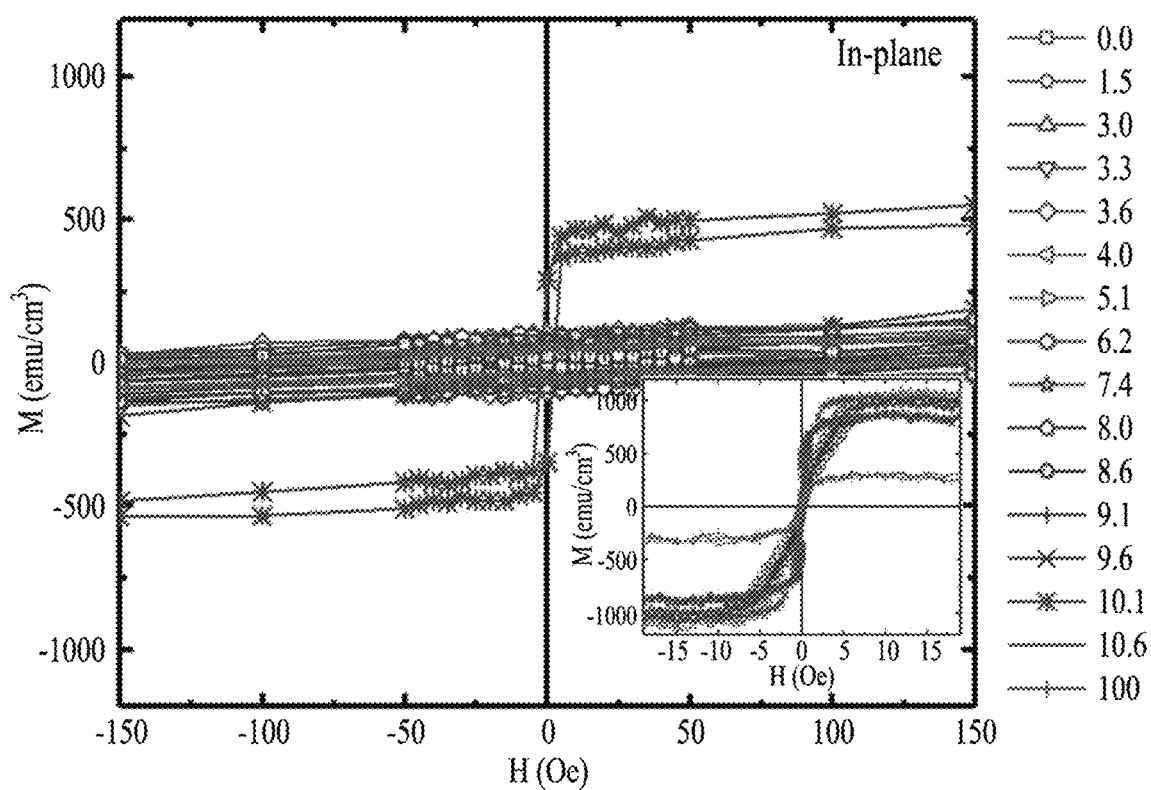

[FIG. 7]
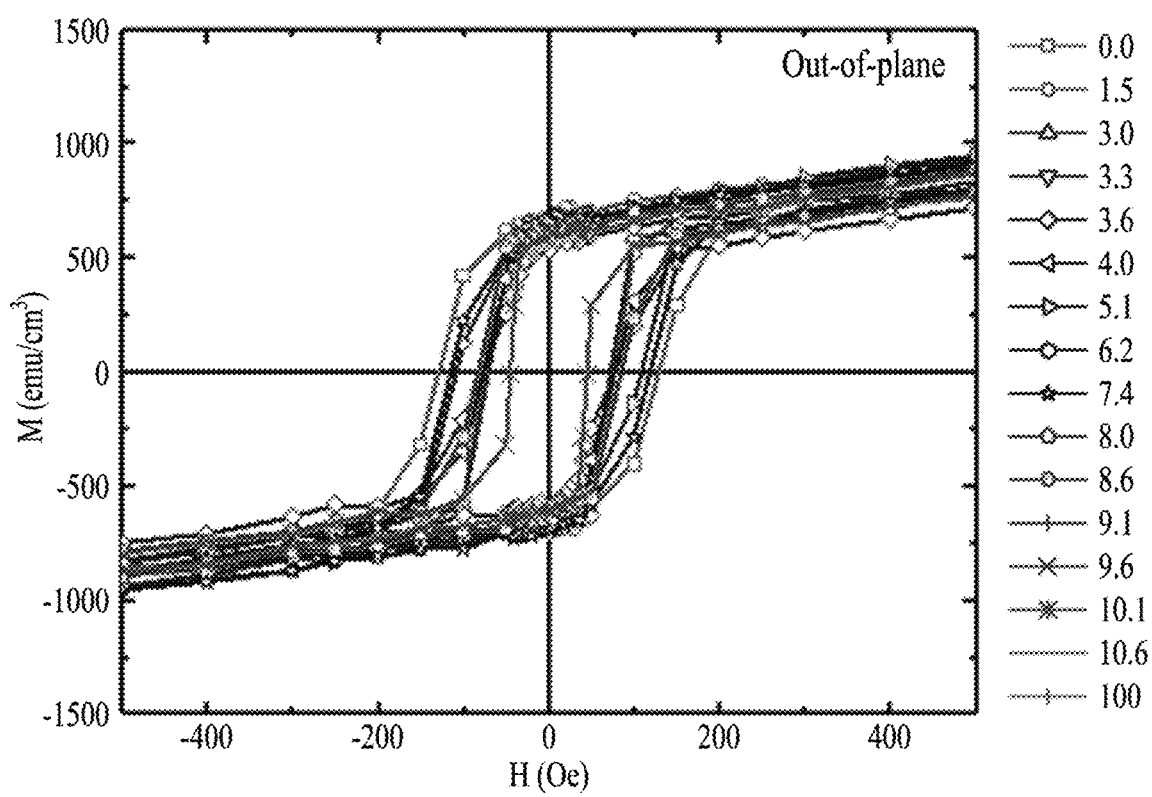

[FIG. 8]
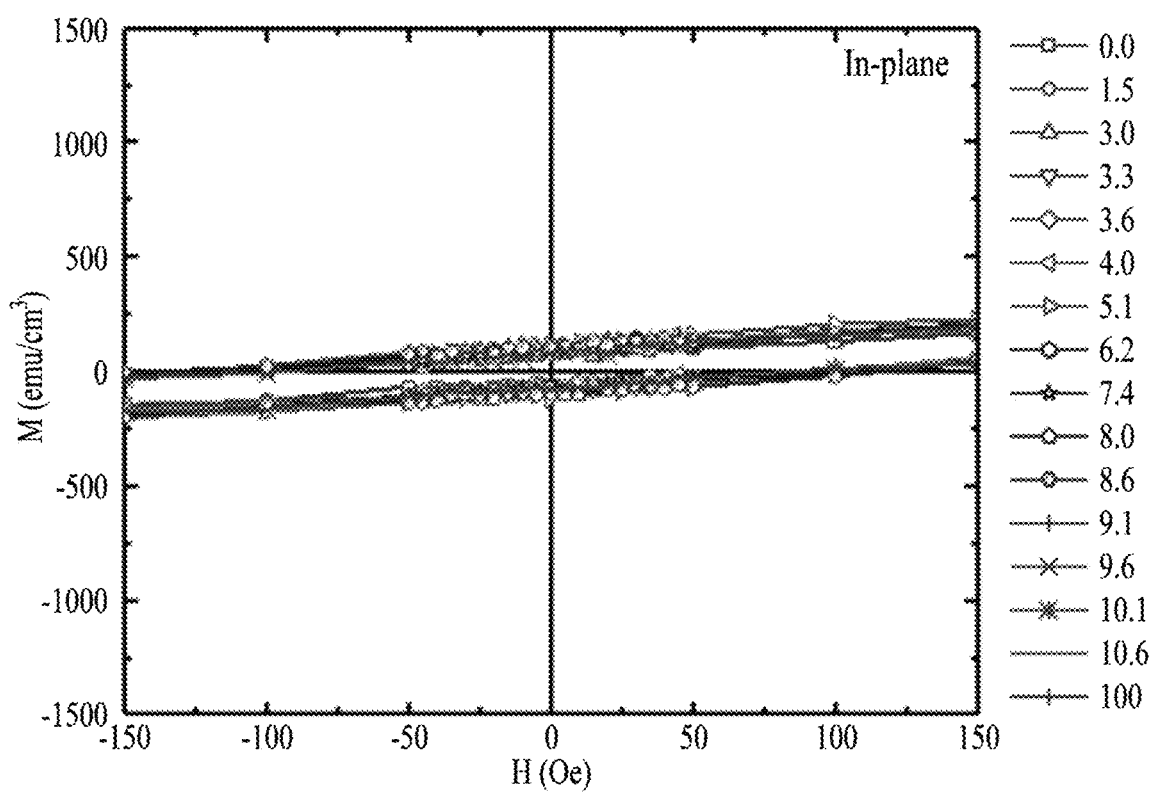

[FIG. 9]
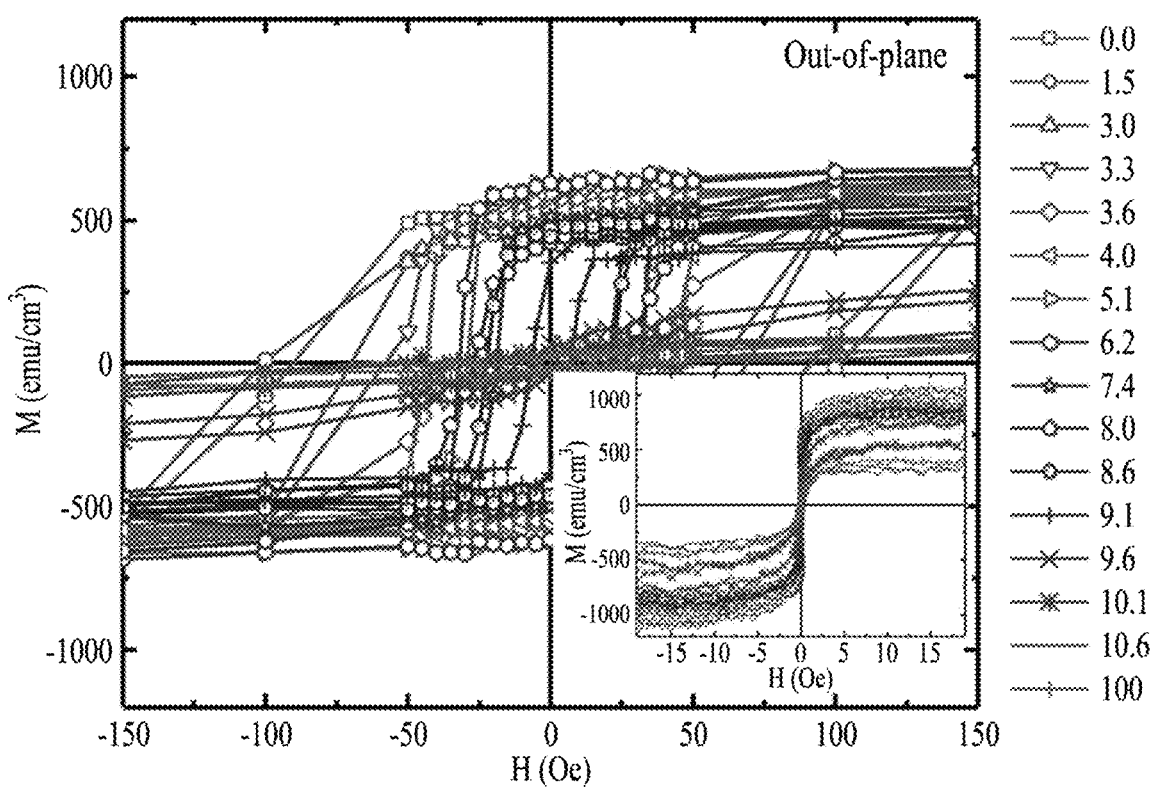

[FIG. 10]
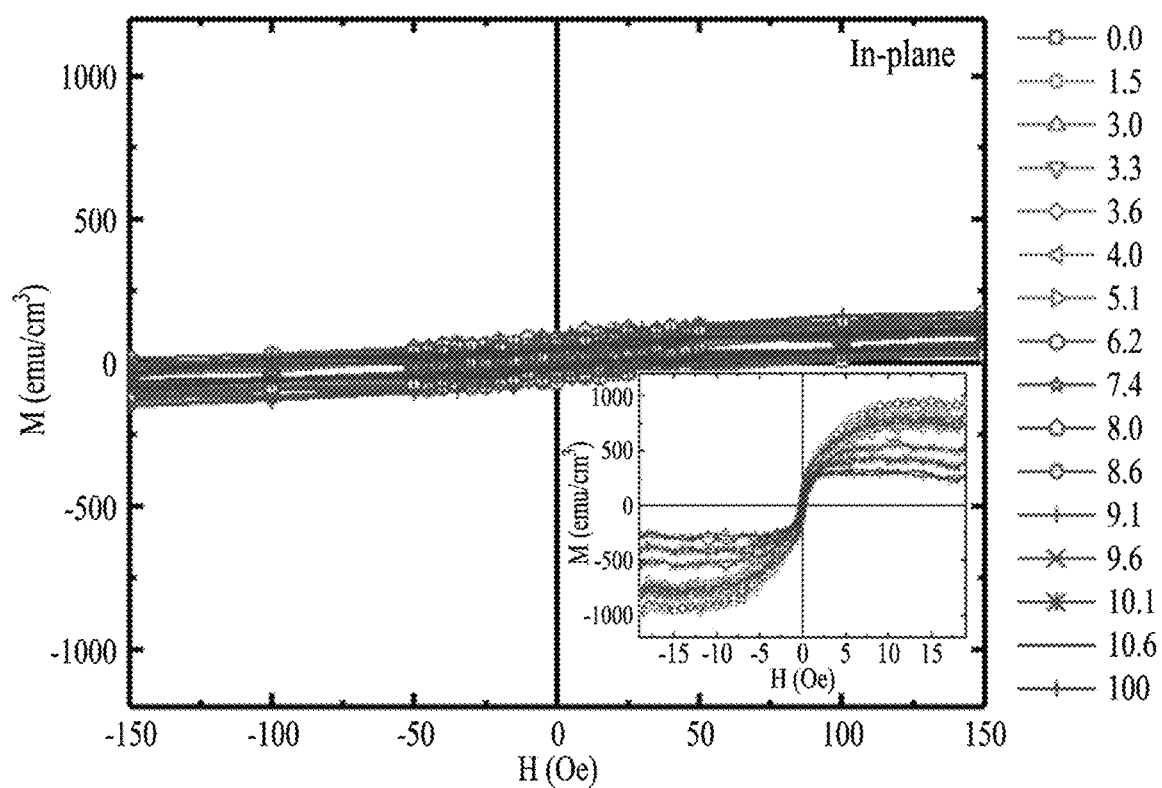

[FIG. 11A]
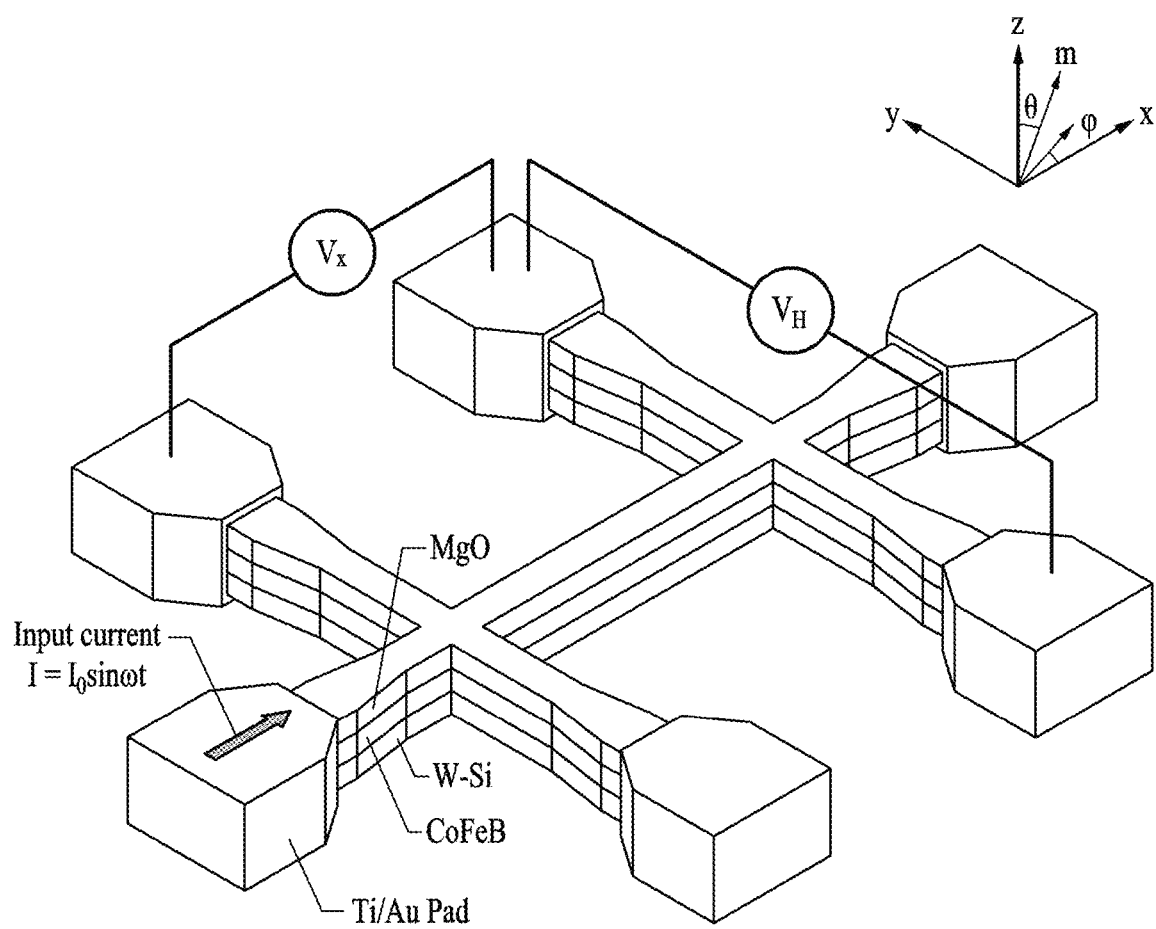

【FIG. 11B】
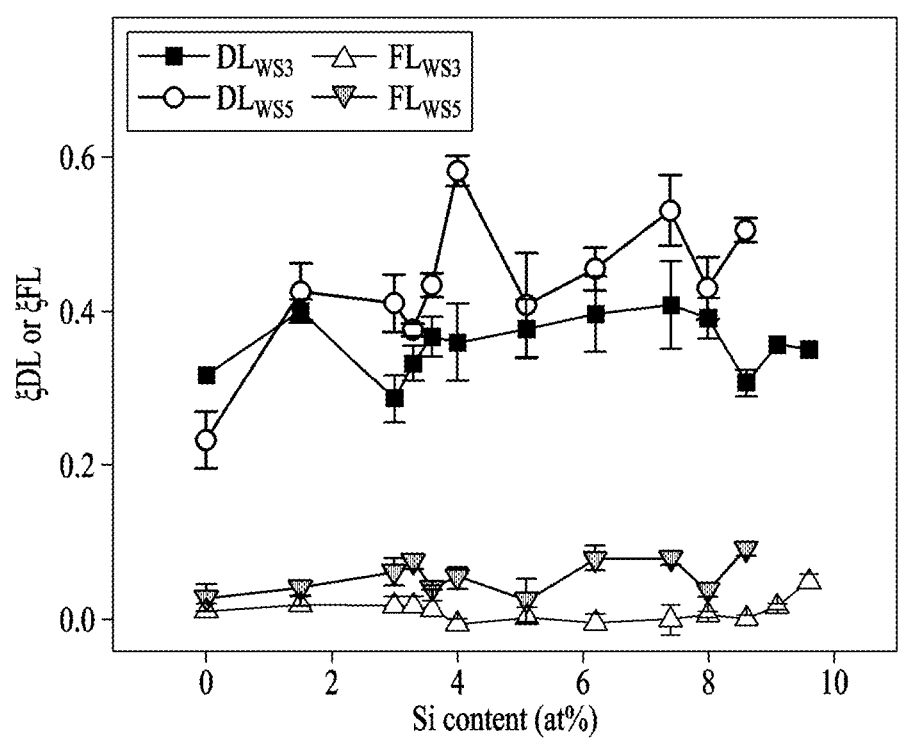

[FIG. 12]
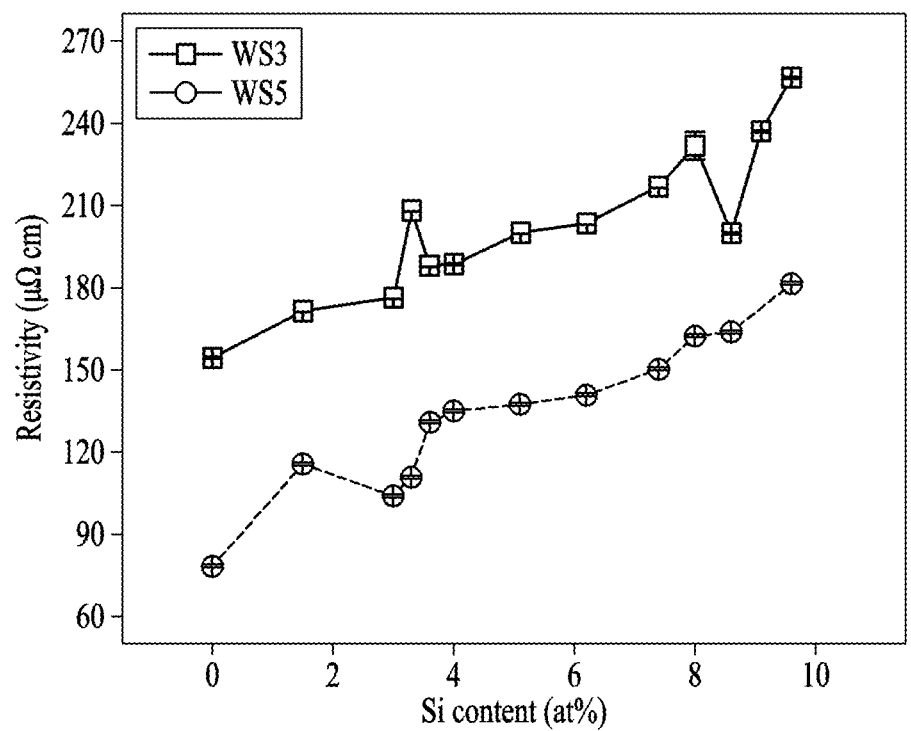

[FIG. 13]
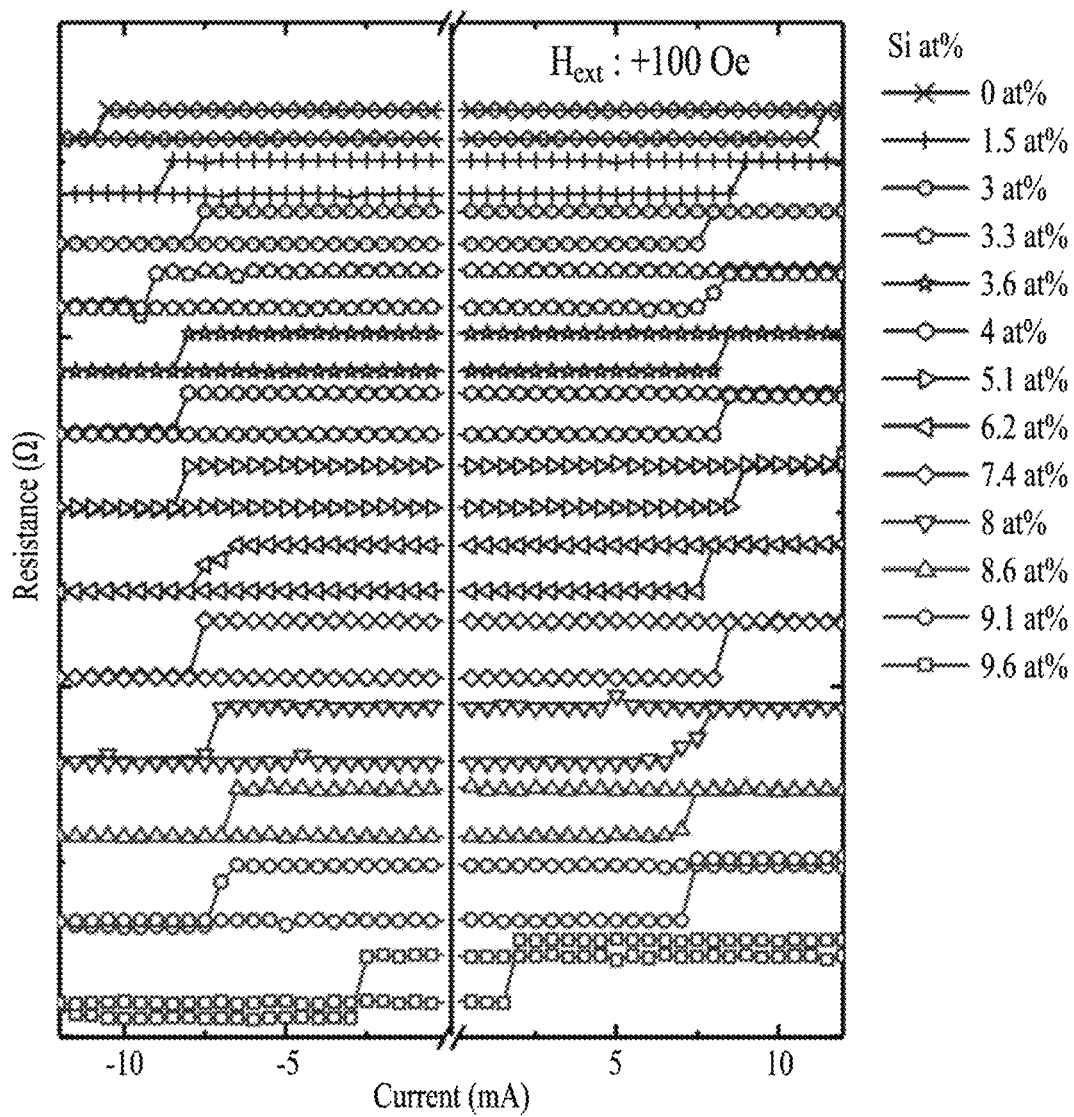

[FIG. 14]
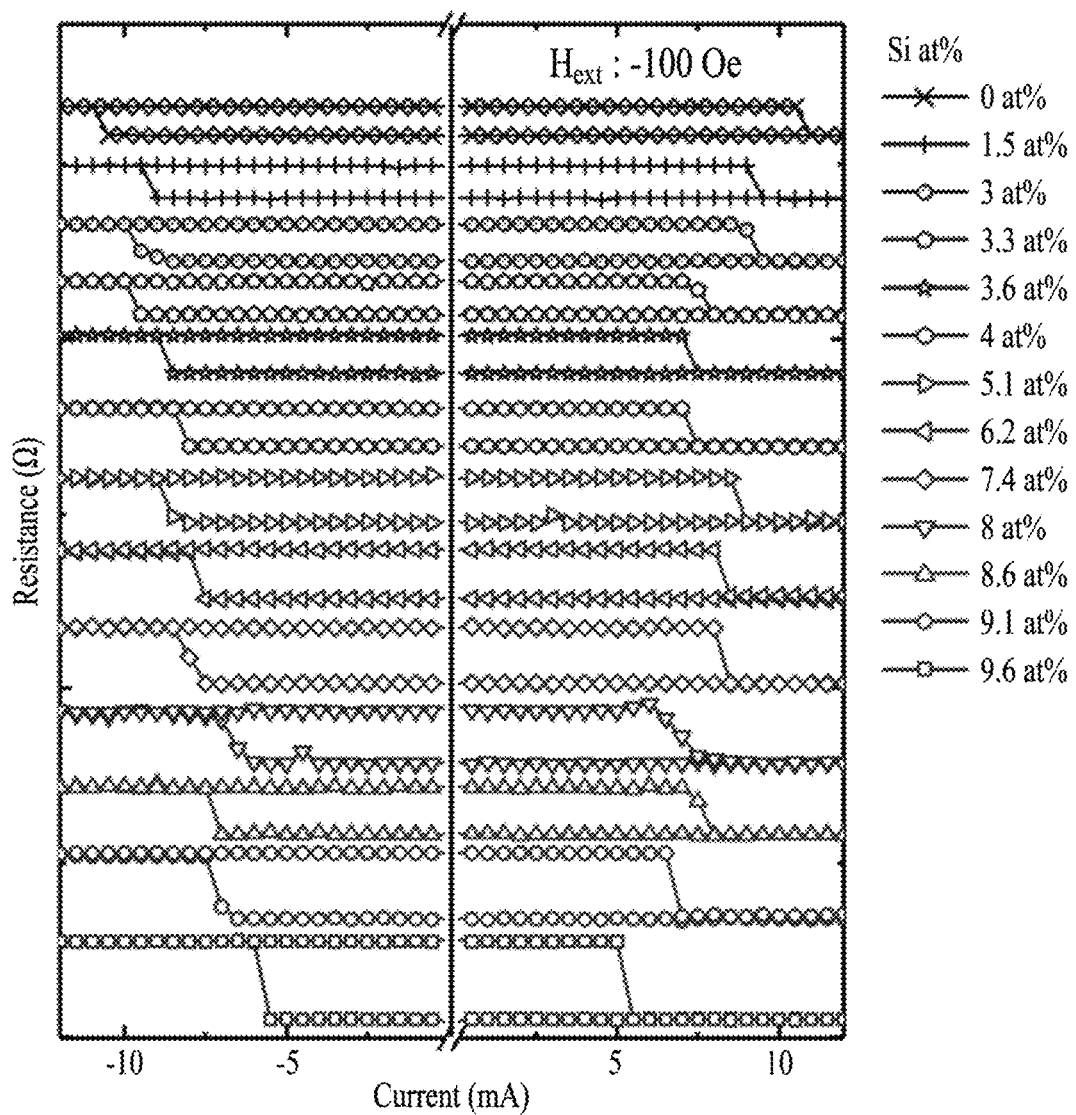

[FIG. 15]
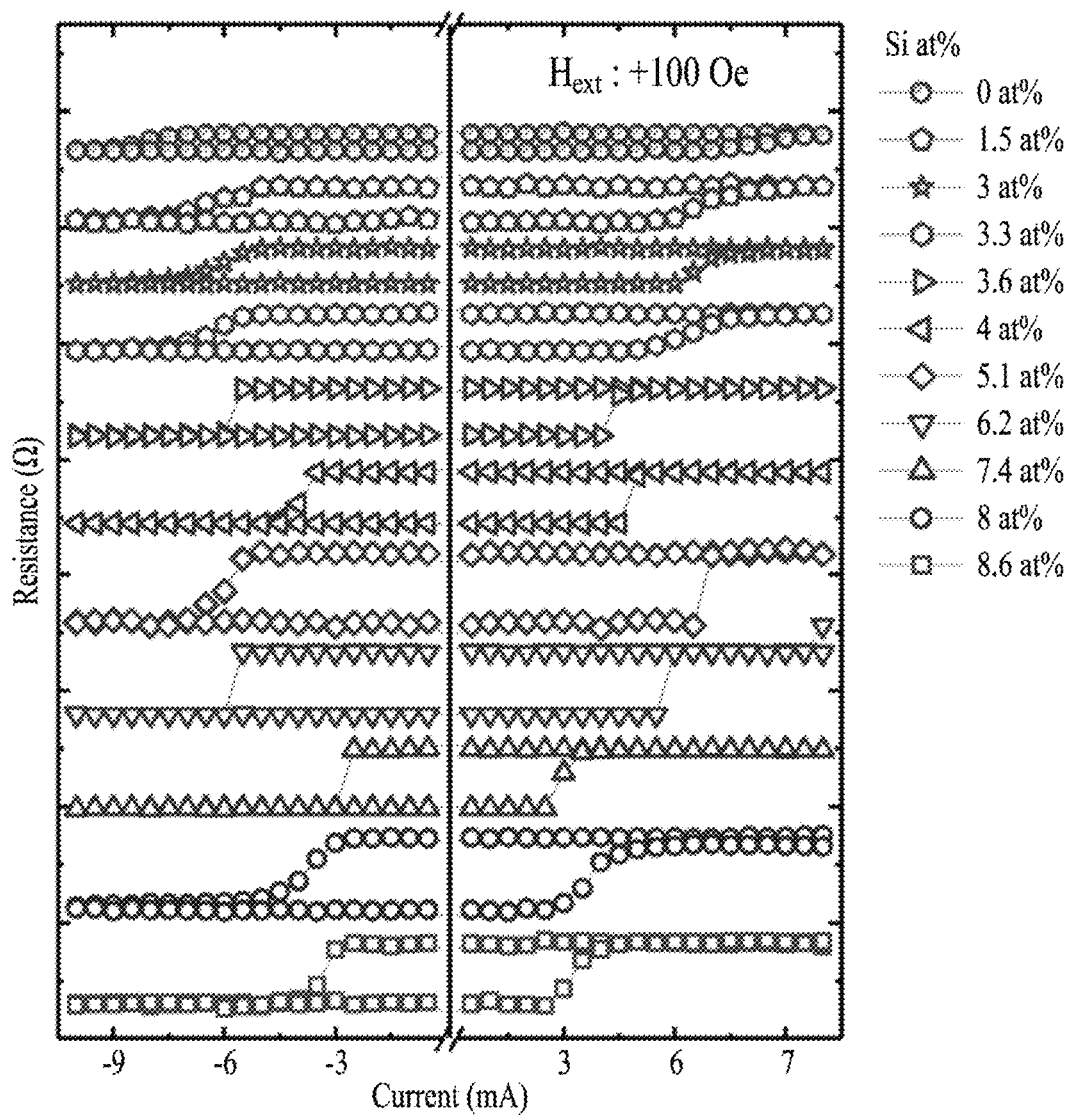

[FIG. 16]
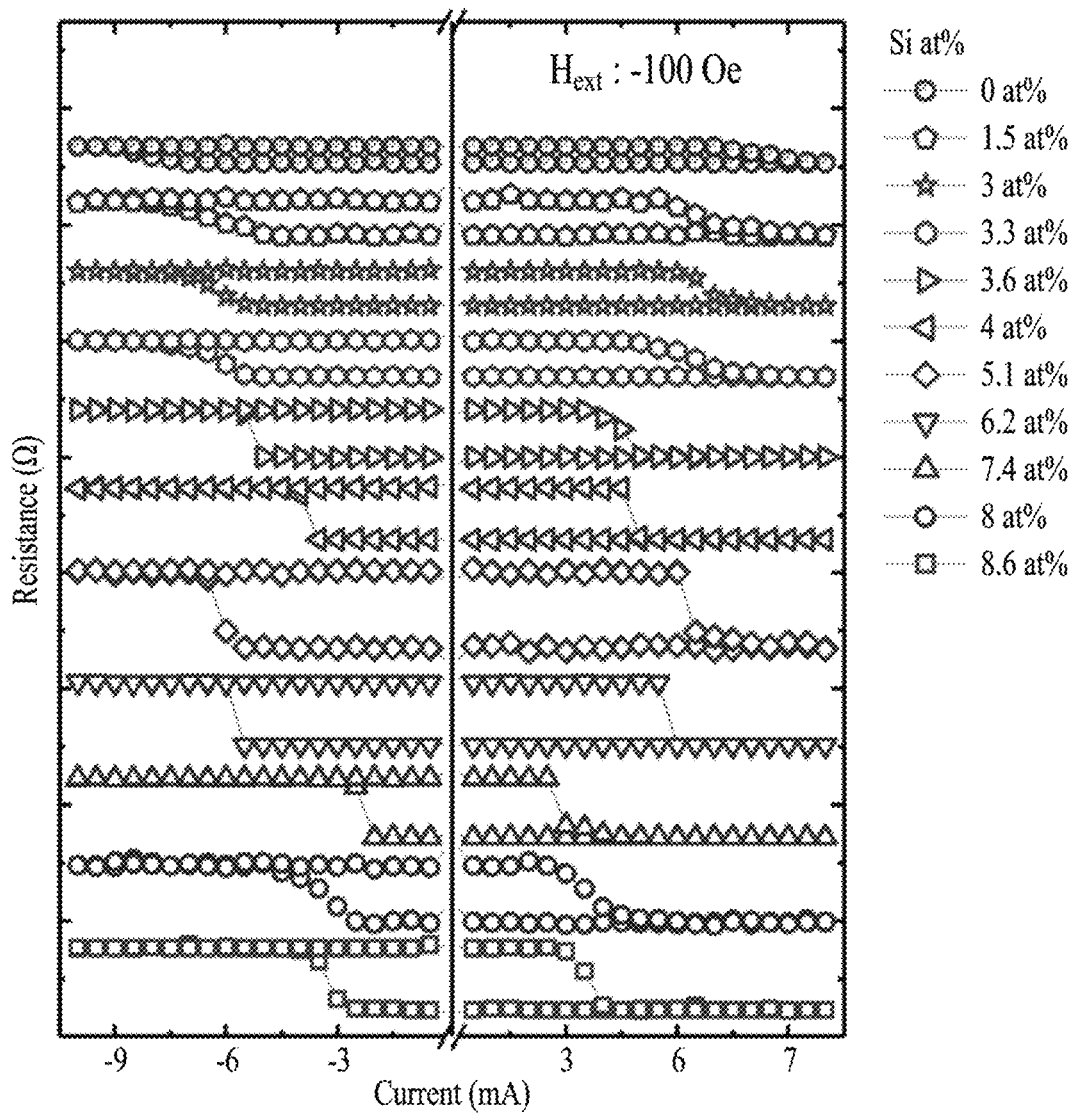

【FIG. 17A】
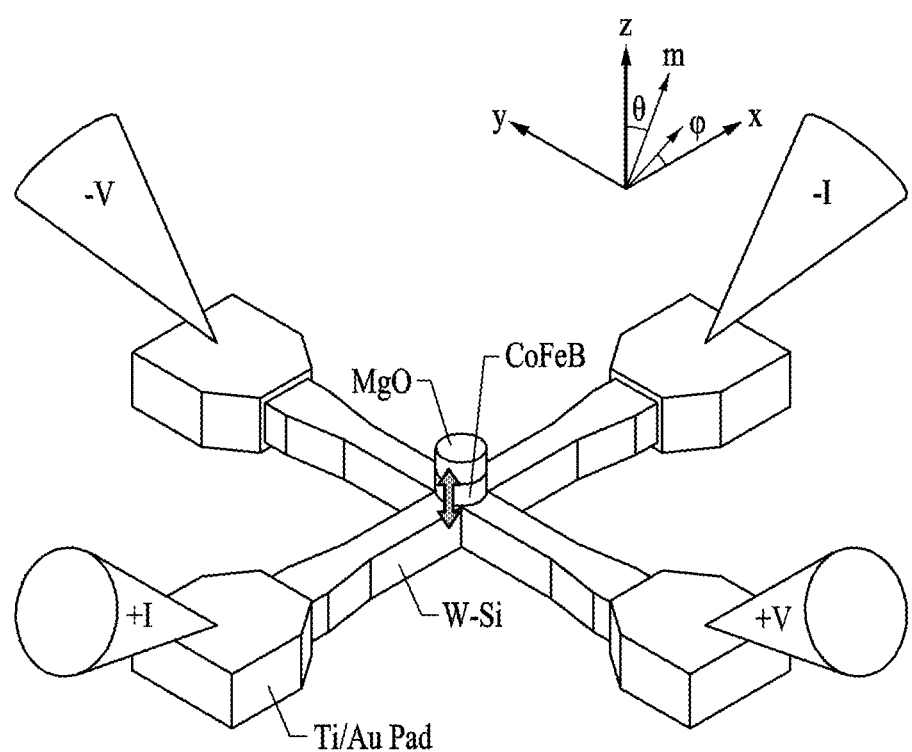

[FIG. 17B]
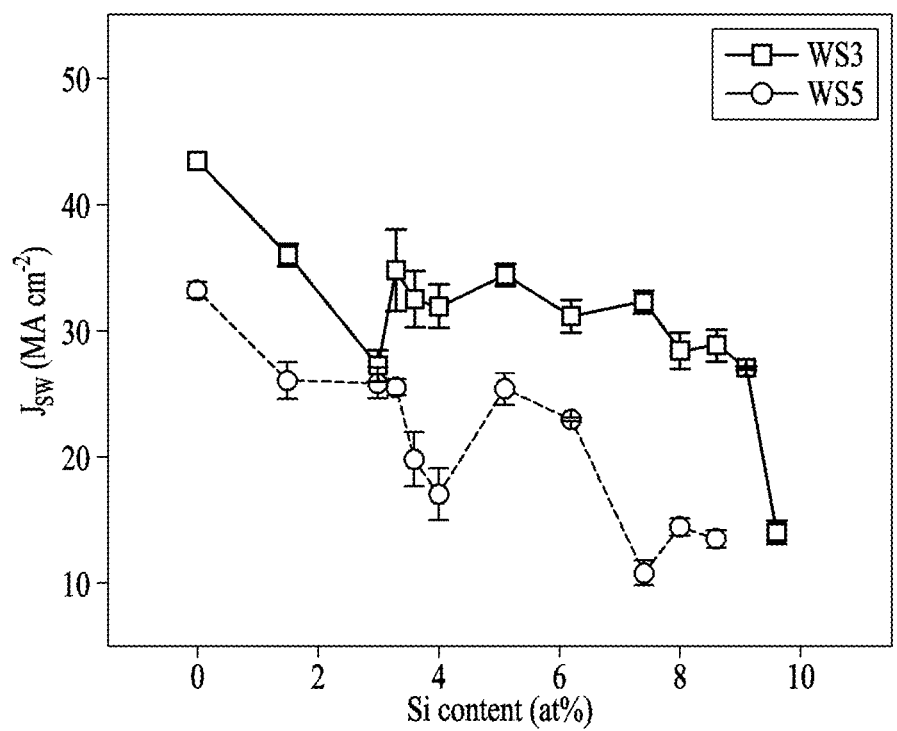

[FIG. 18]
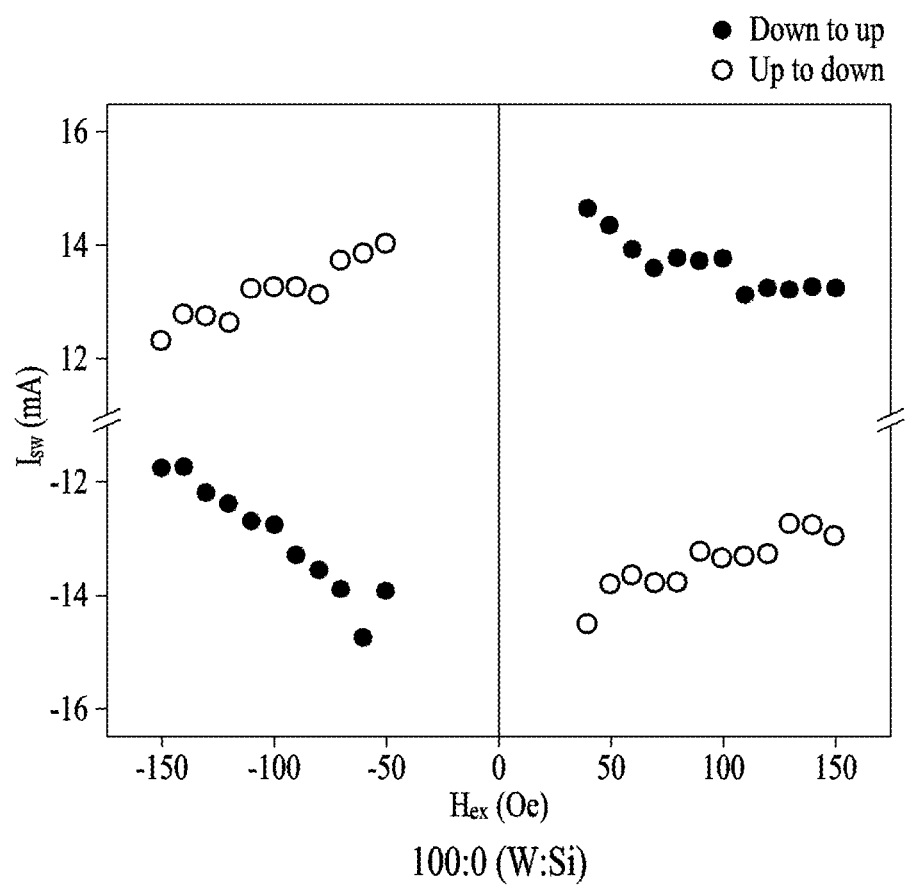

[FIG. 19]
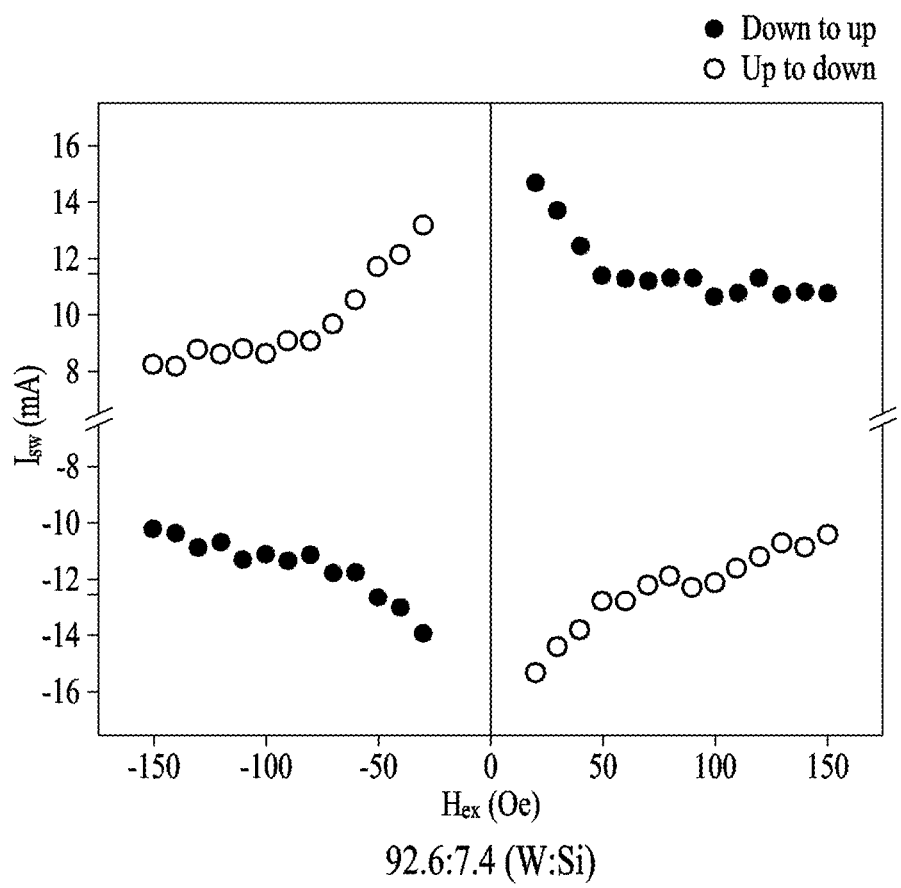

[FIG. 20]
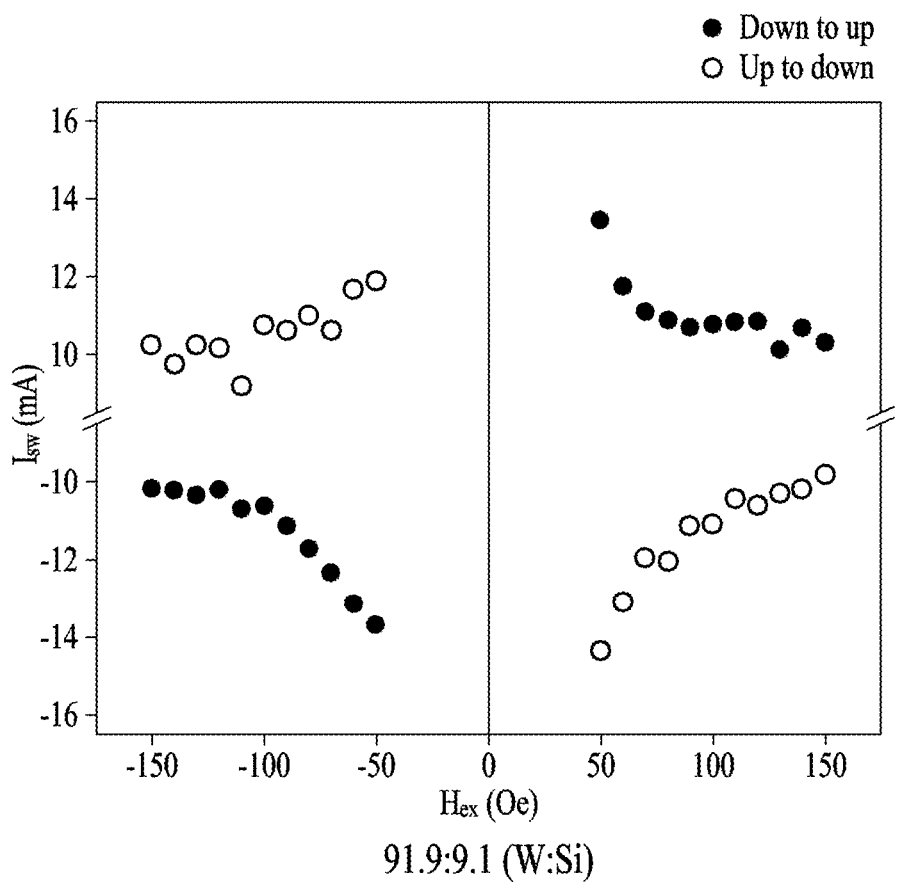

[FIG. 21]
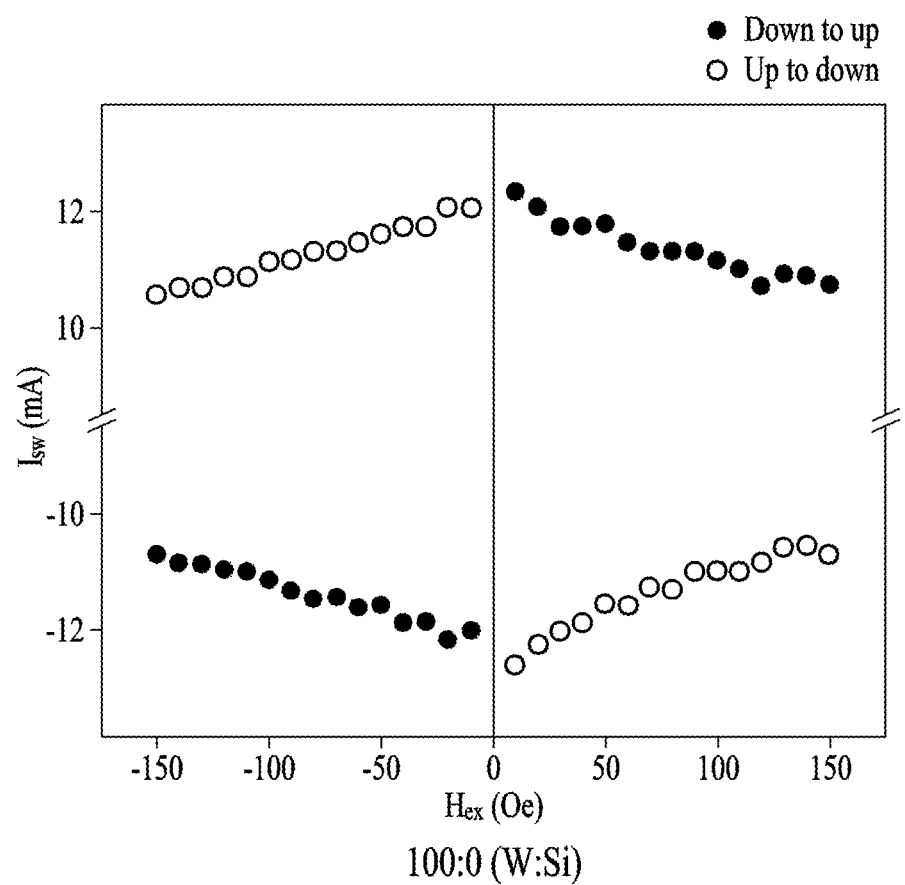
100:0 (W:Si)

[FIG. 22]
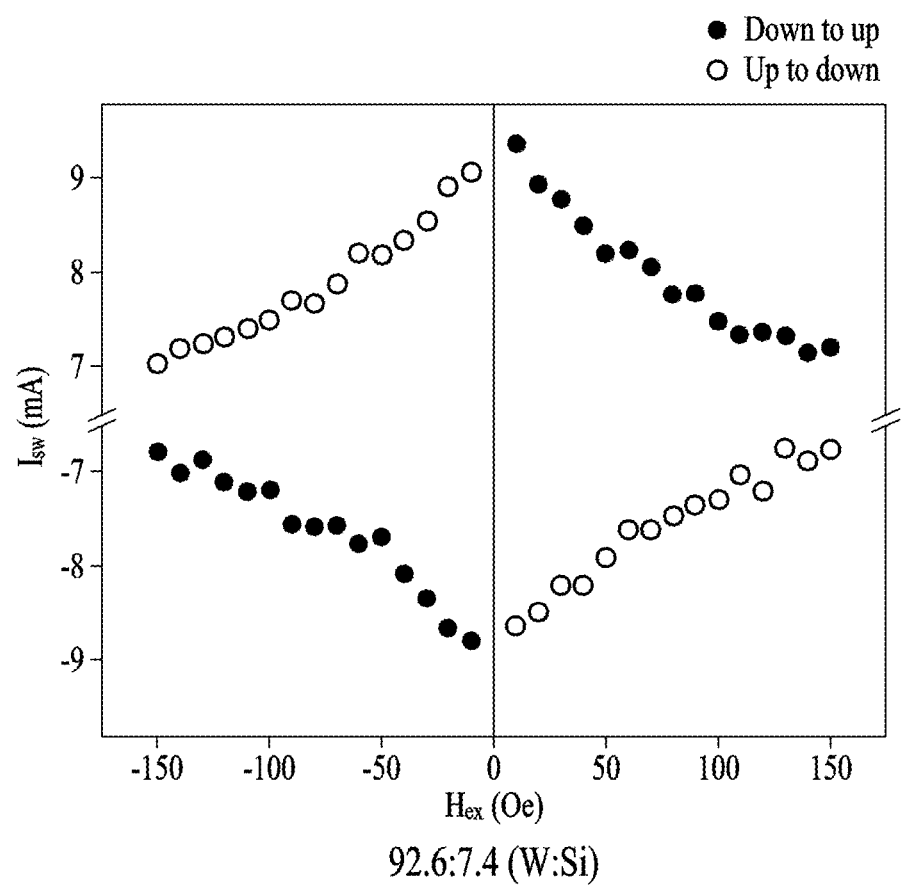
92.6:7.4 (W:Si)

[FIG. 23]
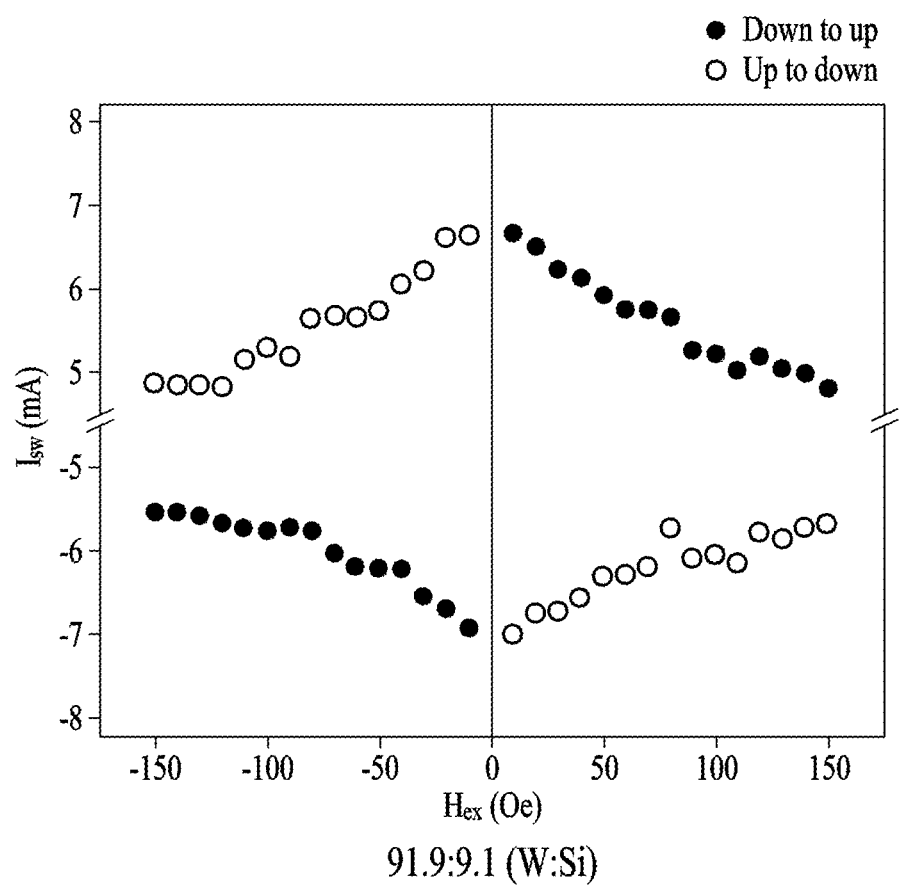
91.9:9.1 (W:Si)

[FIG. 24]
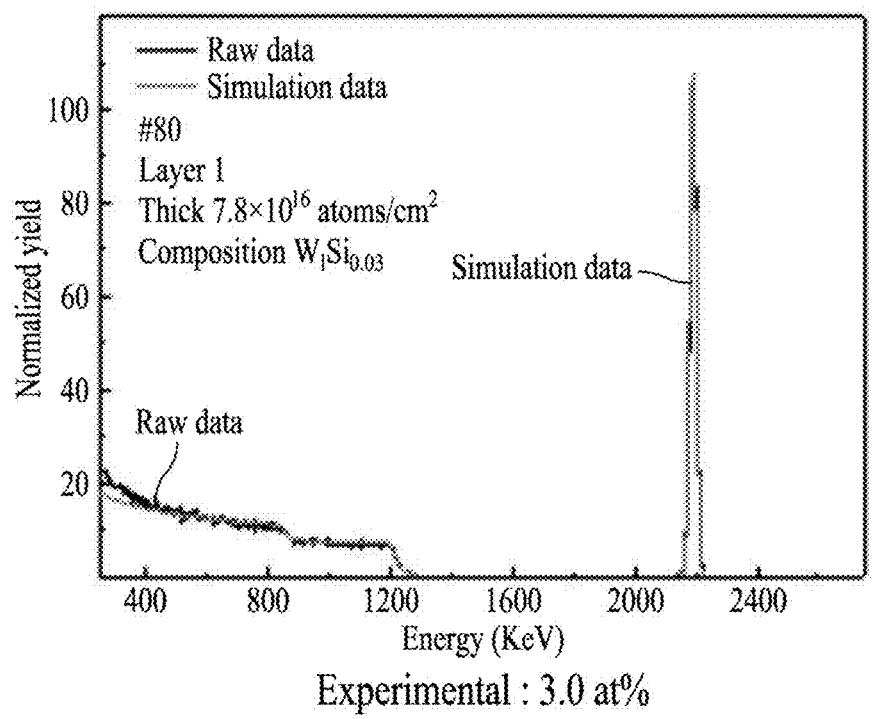
Experimental : 3.0 at%

[FIG. 25]
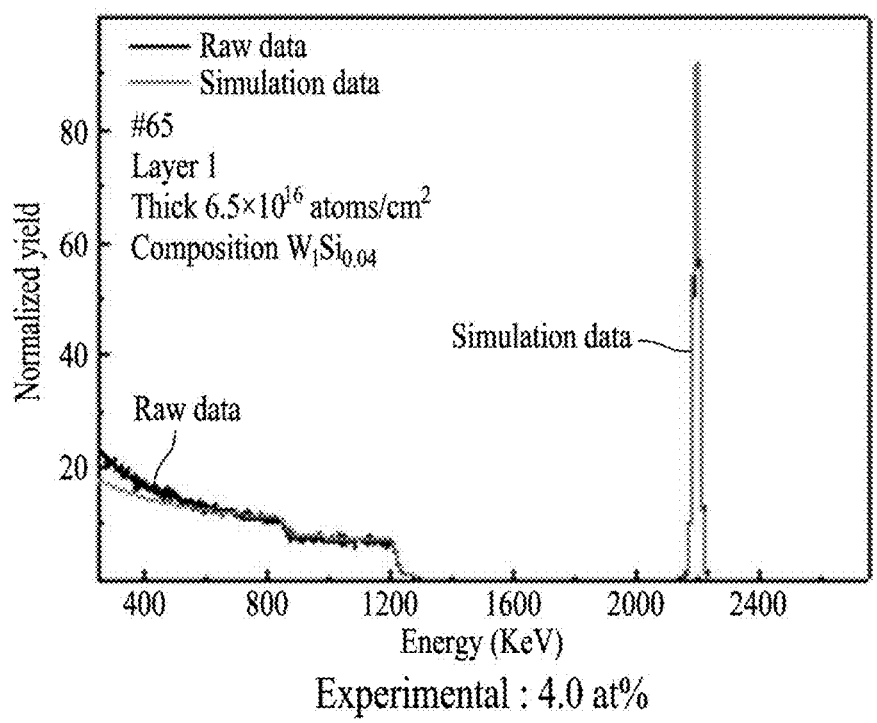

[FIG. 26]
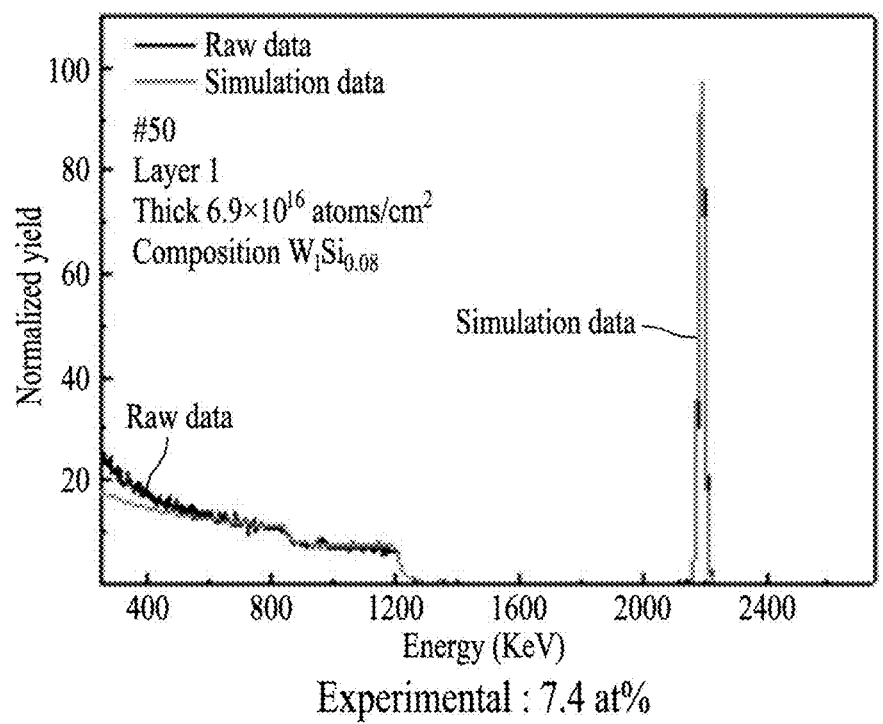

[FIG. 27]
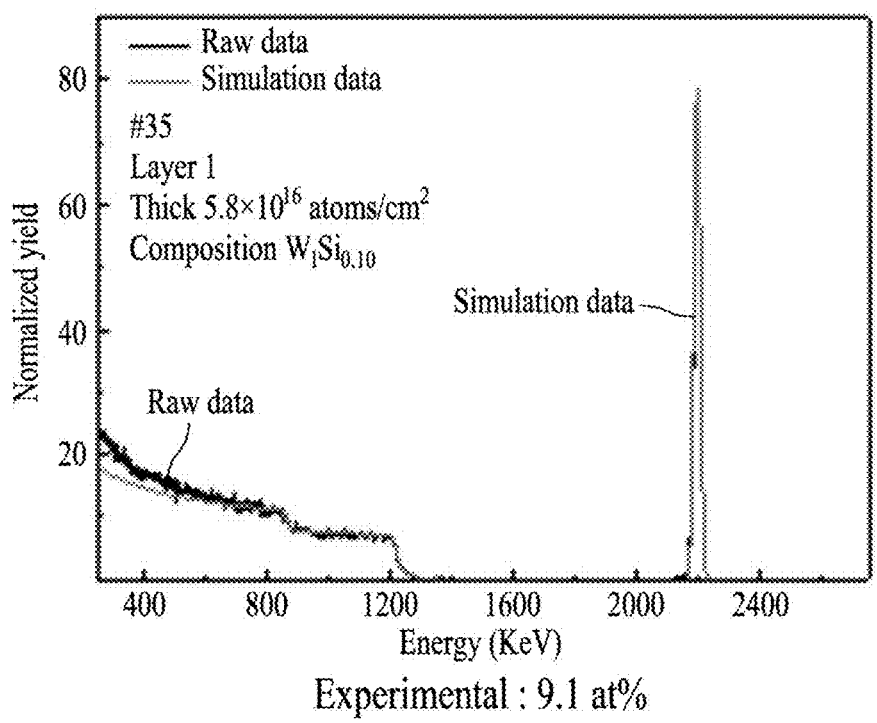

[FIG. 28]
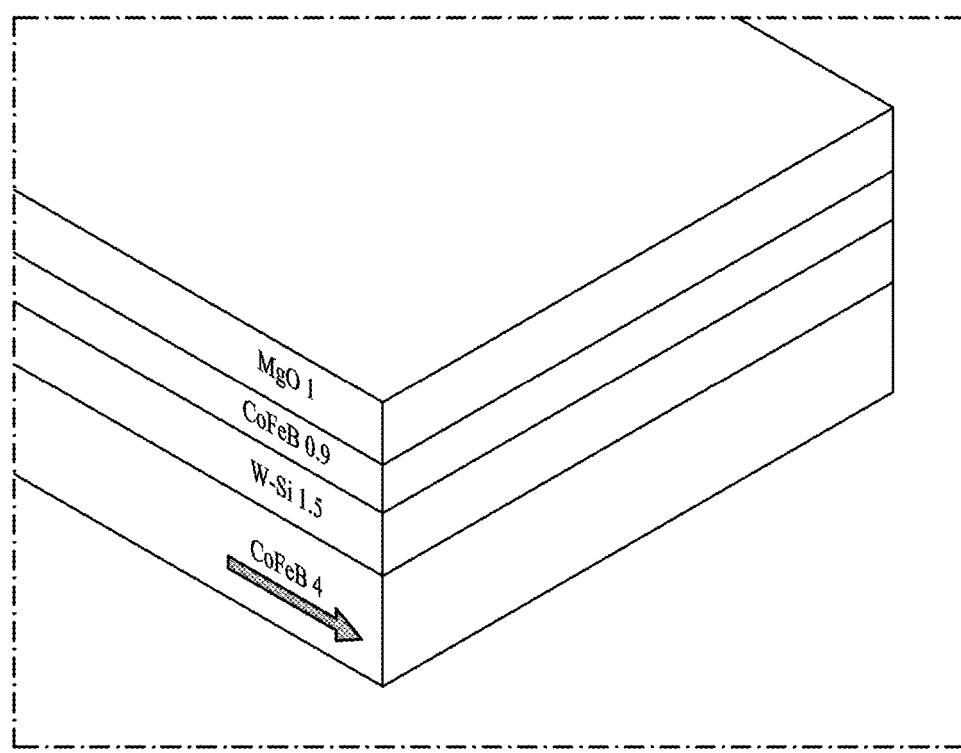

[FIG. 29]
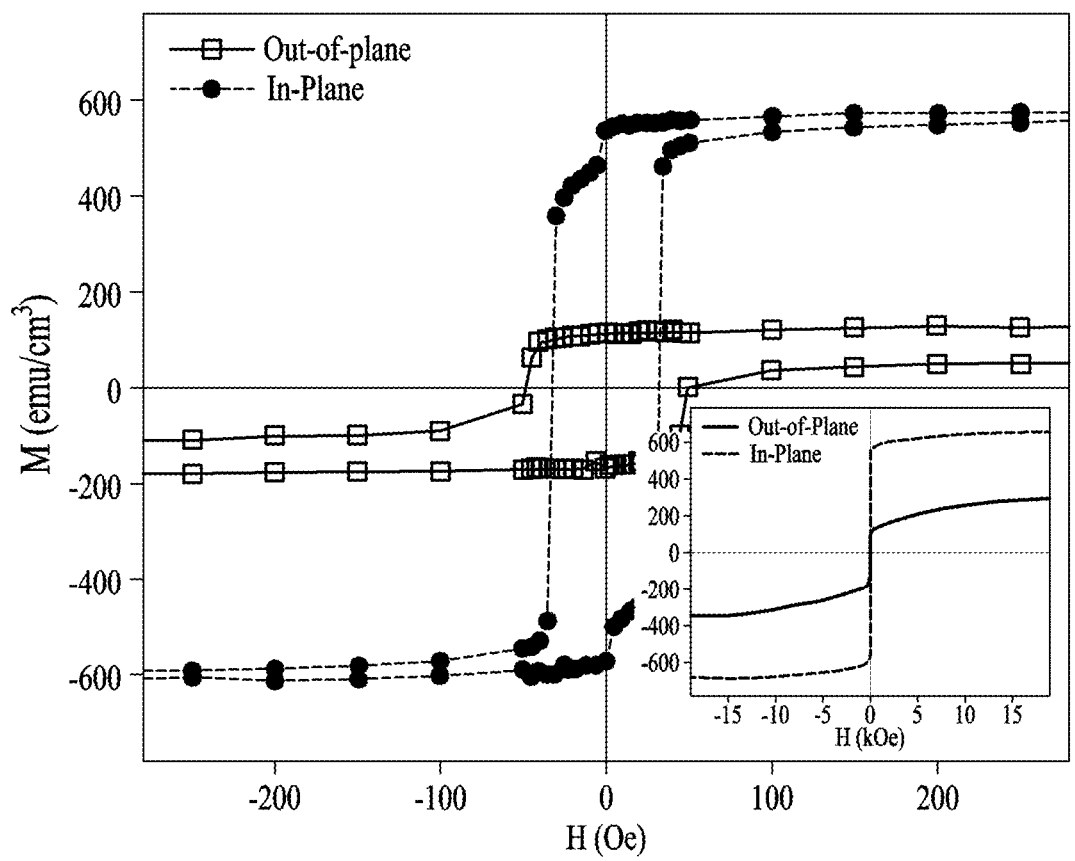

[FIG. 30]
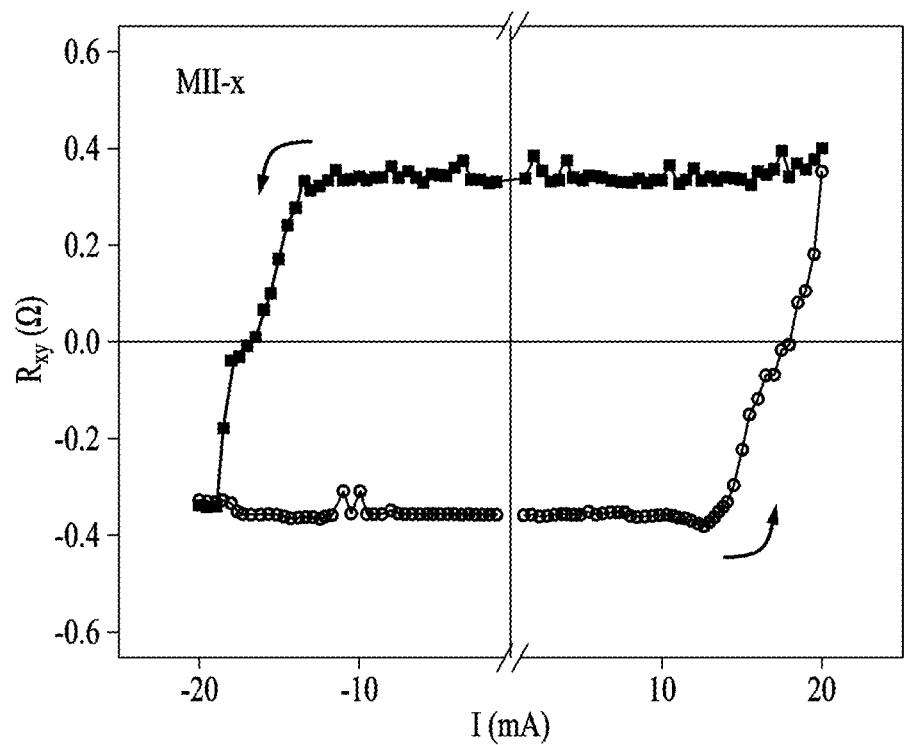

[FIG. 31]
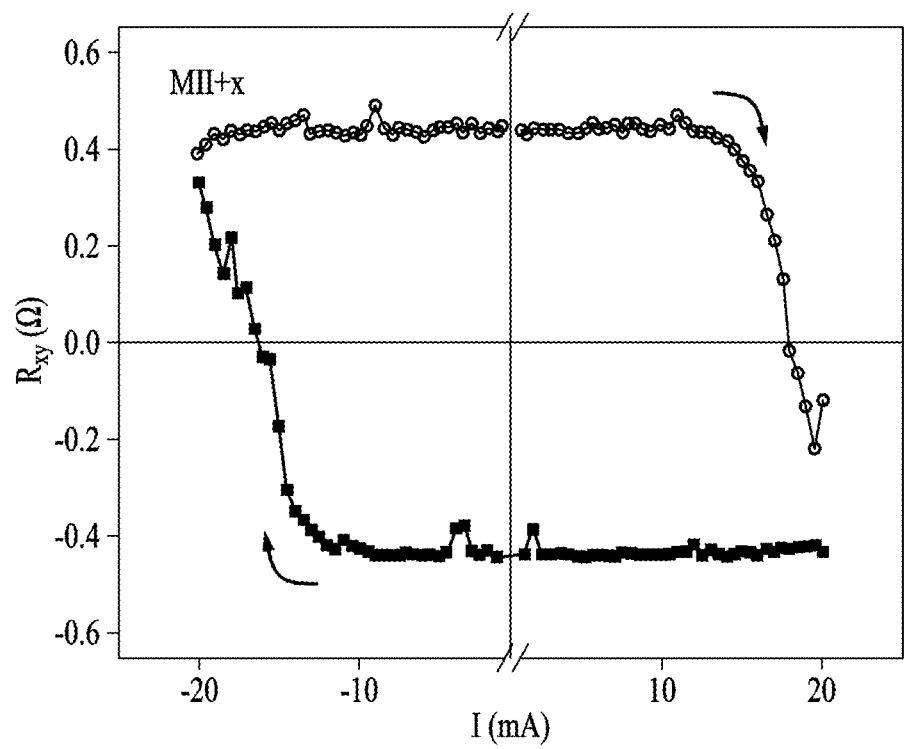

[FIG. 32]
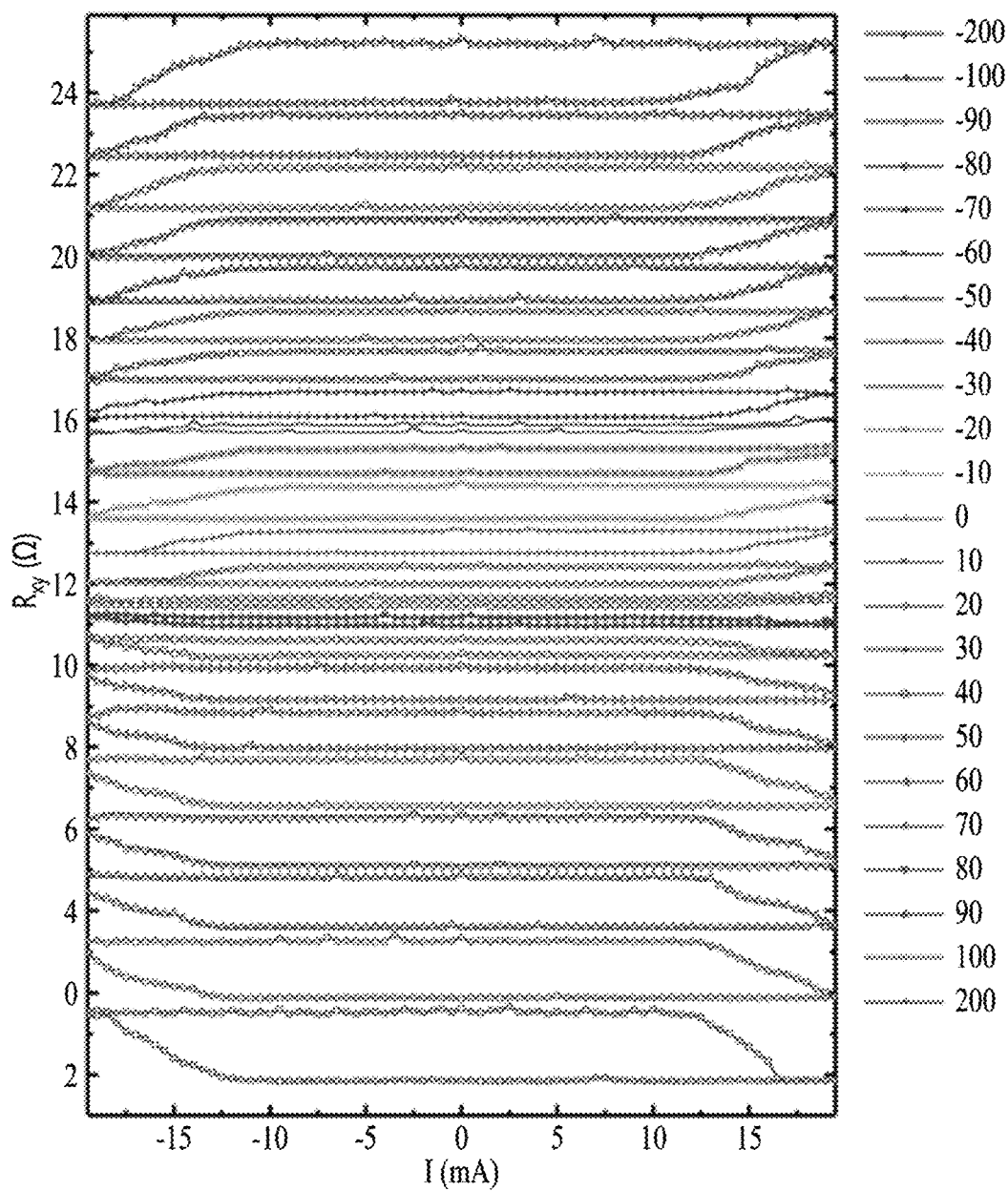

[FIG. 33]
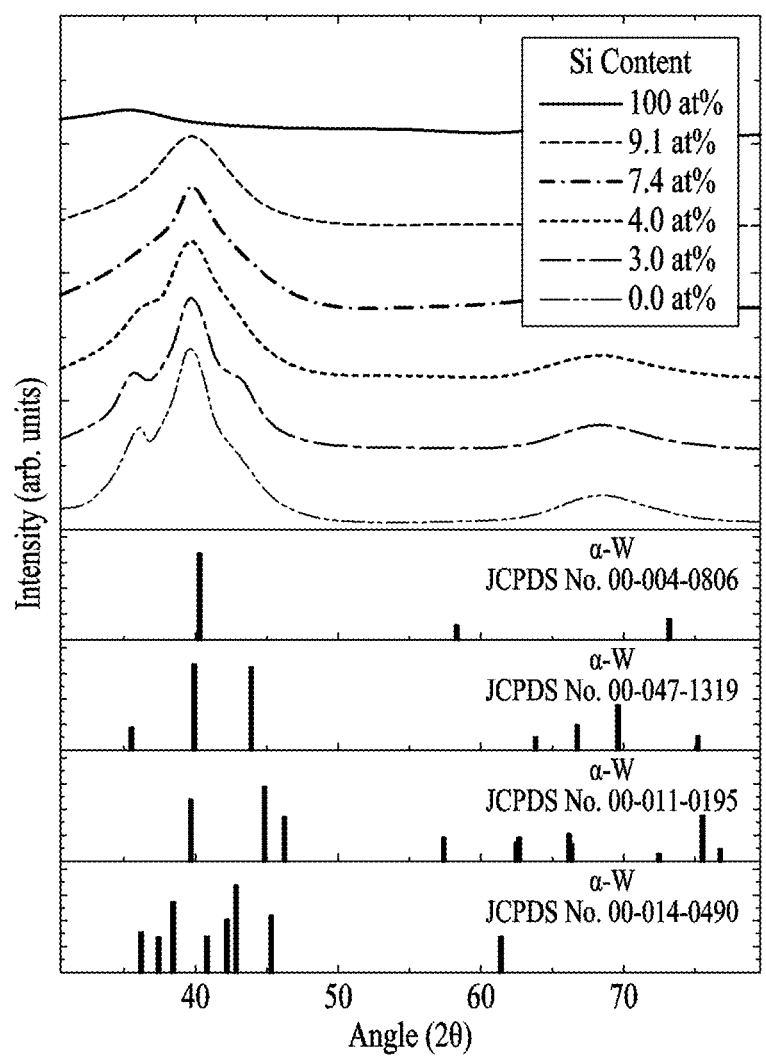

[FIG. 34]
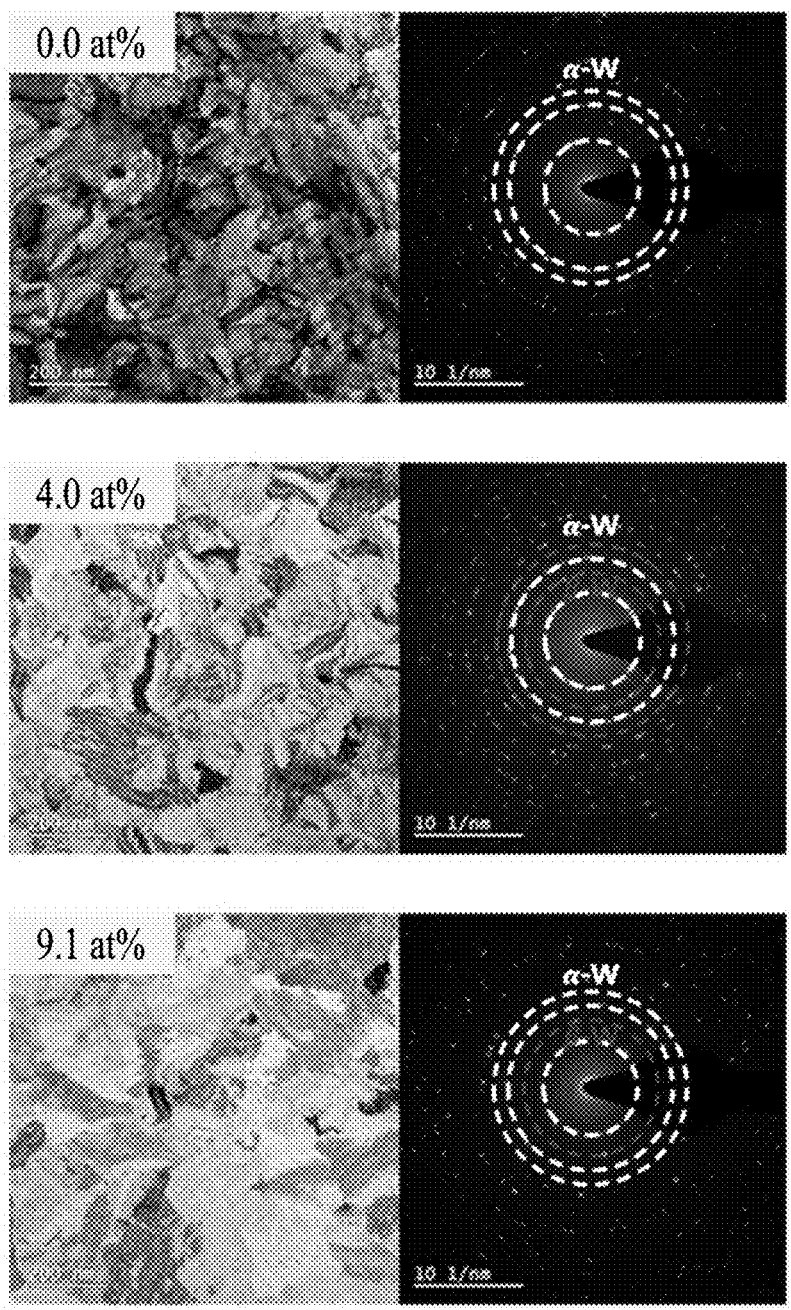

[FIG. 35]
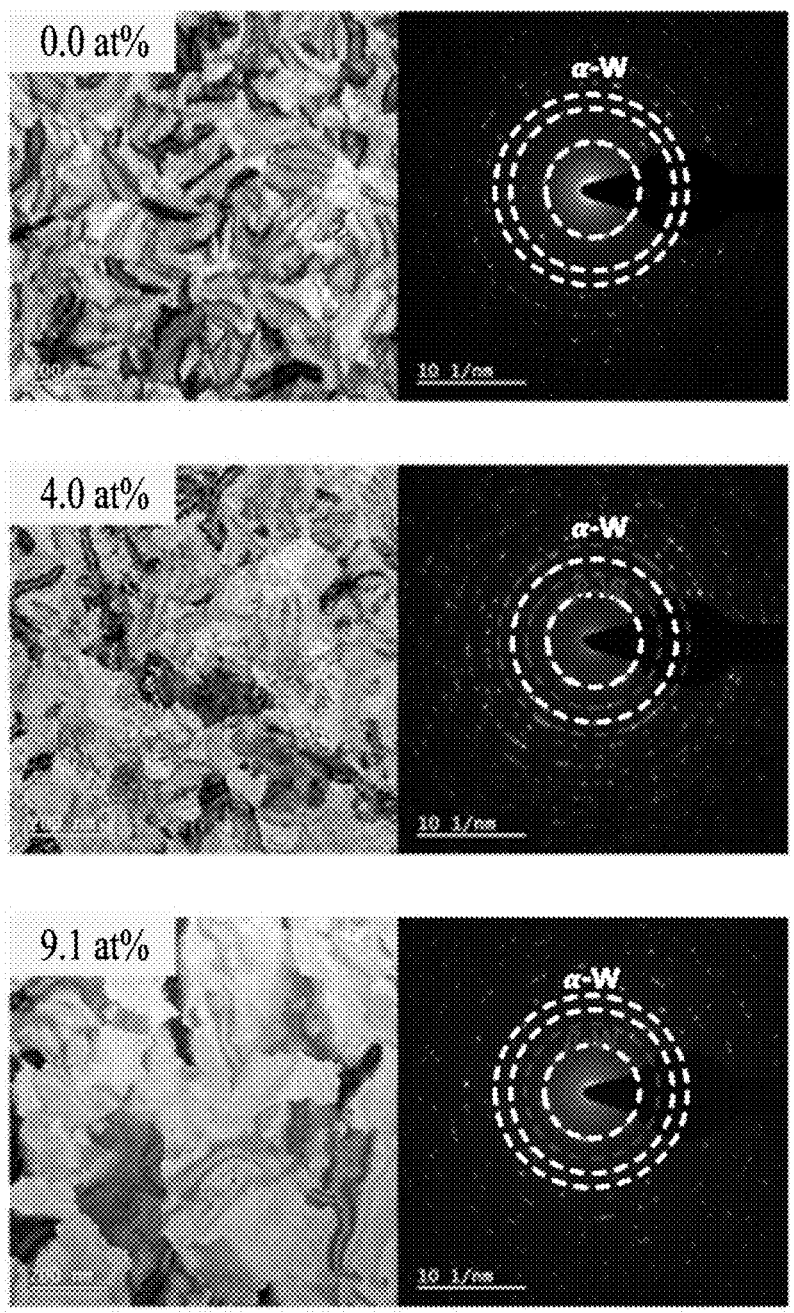

SPIN-ORBIT TORQUE (SOT)-BASED MAGNETIC TUNNEL JUNCTION AND METHOD OF FABRICATING THE SAME

CROSS-REFERENCE TO RELATED APPLICATION

This application claims priority to Korean Patent Application No. 10-2020-0156790, filed on Nov. 20, 2020 and Korean Patent Application No. 10-2021-0104332, filed on Aug. 9, 2021 in the Korean Intellectual Property Office, the disclosure of which is incorporated herein by reference.

BACKGROUND OF THE DISCLOSURE

Field of the Disclosure

The present disclosure relates to a spin-orbit torque (SOT)-based magnetic tunnel junction and a method of fabricating the same, and more particularly, to a spin-orbit torque (SOT)-based magnetic tunnel junction configured to include a W—X alloy thin film having high spin-orbit coupling (where W is tungsten and X includes at least one of group IV semiconductors and group III-V semiconductors) as a spin-orbit active layer, thus being capable of performing spin-orbit torque switching, and having high spin-orbit torque efficiency even at low specific resistance; and a method of manufacturing the spin-orbit torque (SOT)-based magnetic tunnel junction.

Description of the Related Art

A magnetic tunnel junction basically has a triple layer structure of ferromagnetic substance/oxide/ferromagnetic substance, each of which includes a magnetization free layer (FL), a tunnel barrier (TB) and a magnetized pinned layer (PL). Here, the positions of the free layer and the pinned layer may be interchanged. The magnetic tunnel junction uses the property that the value of tunneling current passing through a tunnel barrier is changed depending upon the state in which the spin direction of the adjacent free layer and pinned layer are arranged in parallel or antiparallel with the tunnel barrier interposed therebetween. A resistance difference at this point is called a tunnel magnetoresistance ratio (TMR). The spin direction of the pinned layer is fixed, and information can be input by flowing magnetic field or current to manipulate the spin direction of the free layer.

A magnetic tunnel junction (MTJ), as a core element of a spin-orbit torque (SOT) switching-based magnetic random access memory (MRAM), is composed of a nonmagnetic spin-orbit active layer/first magnetic layer (magnetization free layer, hereinafter referred to as "free layer")/tunnel barrier layer/second magnetic layer (magnetized pinned layer, hereinafter referred to as "pinned layer") and reads information using the tunneling magnetoresistance (TMR) phenomenon that the electrical resistance value of tunneling current passing through an insulating layer is changed according to the relative magnetization directions of the free layer and the pinned layer.

To realize a high tunnel magnetoresistance ratio, high write stability, low write current and high integration, a magnetic tunnel junction must have perpendicular magnetic anisotropy (PMA). PMA means that the magnetization direction of a magnetic layer is perpendicular to a magnetic layer plane.

Recently, the spin-orbit torque (SOT) phenomenon that induces switching of a free layer using the spin Hall effect or the Rashba effect occurring when current flows in a parallel direction in a plane of a spin-orbit active layer adjacent to a free layer was found. Accordingly, SOT is attracting attention as a technology capable of writing information at higher speed and lower current consumption than the existing spin-transfer torque (STT) writing method.

Therefore, there is a need to use a material having a large spin Hall angle (SHA), which is a physical quantity representing low specific resistance and high spin-orbit torque efficiency, as a spin-orbit active layer.

RELATED ART DOCUMENTS

Patent Documents

Korean Patent Application Publication No. 10-2020-0030277, "SEMICONDUCTOR DEVICE HAVING SPIN-ORBIT TORQUE LINE AND OPERATION METHOD THEREOF"

Korean Patent Application Publication No. 10-2020-0066848, "SEMICONDUCTOR DEVICE HAVING SPIN-ORBIT TORQUE LINE"

SUMMARY OF THE DISCLOSURE

Therefore, the present disclosure has been made in view of the above problems, and it is one object of the present disclosure to provide a spin-orbit torque-based magnetic tunnel junction including a W—X alloy thin film (where W is tungsten and X includes at least one of group IV semiconductors and group III-V semiconductors) having high spin-orbit coupling as a spin-orbit active layer, and thus, enabling spin-orbit torque switching and exhibiting high spin-orbit torque efficiency even at low specific resistance; and a method of fabricating the spin-orbit torque-based magnetic tunnel junction.

It is another object of the present disclosure to provide a spin-orbit torque-based magnetic tunnel junction in which X composition in a W—X alloy can be adjusted to control a switching current; and a method of fabricating the spin-orbit torque-based magnetic tunnel junction.

It is yet another object of the present disclosure to provide a spin-orbit torque-based magnetic tunnel junction including a tungsten-silicon alloy as a spin-orbit active layer, and thus, being capable of maintaining perpendicular magnetic anisotropy (PMA) in various thermal treatment temperature ranges; and a method of fabricating the spin-orbit torque-based magnetic tunnel junction.

In accordance with an aspect of the present disclosure, the above and other objects can be accomplished by the provision of a spin-orbit torque (SOT)-based magnetic tunnel junction, including: a spin-orbit active layer formed on the substrate; a free layer formed on the spin-orbit active layer; a tunnel barrier layer formed on the free layer; and a pinned layer formed on the tunnel barrier layer, wherein the spin-orbit active layer includes a W—X alloy (where W is tungsten and X includes at least one of group IV semiconductors and group III-V semiconductors).

The spin-orbit active layer may be an electrode configured to provide an in-plane current in contact with the free layer.

A switching current may be decreased as a content of X included in the W—X alloy increases.

A content of X included in the W—X alloy may be 0.1 at % to 10.6 at %.

A switching current of the SOT-based magnetic tunnel junction may be decreased as a thermal treatment temperature at which perpendicular magnetic anisotropy exhibits increases.

A thermal treatment temperature at which the perpendicular magnetic anisotropy exhibits may be 300° C. to 500° C.

A content of X included in the W—X alloy may be adjusted according to the thermal treatment temperature at which the perpendicular magnetic anisotropy exhibits.

The spin-orbit active layer, the free layer, the tunnel barrier layer and the pinned layer may have a cross shape in a plan view.

The spin-orbit active layer may have a cross shape in a plan view, and the free layer, the tunnel barrier layer and the pinned layer may be arranged in a form of an island in a center of the cross shaped-spin-orbit active layer.

A surface, which is in contact with the spin-orbit active layer, of the substrate may include a native oxide layer.

A buffer layer may be further included under the spin-orbit active layer.

A capping layer may be further provided on the pinned layer of the spin-orbit torque-based magnetic tunnel junction.

In accordance with another aspect of the present disclosure, there is provided a method of fabricating a spin-orbit torque-based magnetic tunnel junction, the method including: forming a spin-orbit active layer on a substrate; forming a free layer on the spin-orbit active layer; forming a tunnel barrier layer on the free layer; forming a pinned layer on the tunnel barrier layer; and thermal-treating the free layer and the pinned layer to exhibit perpendicular magnetic anisotropy, wherein, in the forming of the spin-orbit active layer, W target and X target are simultaneously sputtered in a vacuum chamber such that a W—X alloy thin film (where W is tungsten and X includes at least one of group IV semiconductors and group III-V semiconductors) is formed on the substrate disposed in the vacuum chamber.

A composition of the W—X alloy thin film may be adjusted according to power of the W target and the X target.

A content of X included in the W—X alloy thin film may be 0.1 at % to 10.6 at %.

A switching current may be decreased as a temperature of the thermal treatment increases.

A temperature of the thermal treatment may be 300° C. to 500° C.

A content of X included in the W—X alloy may be adjusted according to the temperature of the thermal treatment.

The forming of the spin-orbit active layer may further include patterning the W—X alloy thin film in a cross shape.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a sectional view of a spin-orbit torque (SOT)-based magnetic tunnel junction according to an embodiment of the present disclosure;

FIG. 2 illustrates a plan view of a spin-orbit torque-based magnetic tunnel junction according to an embodiment of the present disclosure;

FIG. 3 is a flowchart illustrating a method of manufacturing a spin-orbit torque-based magnetic tunnel junction according to an embodiment of the present disclosure;

FIG. 4 illustrates a sectional view of a structure for measuring the spin-orbit torque efficiency of a spin-orbit torque-based magnetic tunnel junction according to an embodiment of the present disclosure;

FIG. 5 illustrates magnetic hysteresis curves dependent upon a silicon content (0 at % to 10.6 at %) in a spin-orbit active layer when a magnetic field was applied in an out-of-plane direction of a thin film to the spin-orbit torque-based magnetic tunnel junction according to an embodiment of the present disclosure (hereinafter referred to as W—Si/CoFeB/MgO/Ta structure according to Example 1-1), shown in FIG. 4, thermally treated at 300° C. for 1 hour, and FIG. 6 illustrates magnetic hysteresis curves dependent upon a silicon content (0 at % to 10.6 at %) in a spin-orbit active layer when a magnetic field was applied in an in-plane direction of a thin film;

FIG. 7 illustrates magnetic hysteresis curves dependent upon a silicon content (0 at % to 10.6 at %) in a spin-orbit active layer when a magnetic field was applied in an out-of-plane direction of a thin film to the W—Si/CoFeB/MgO/Ta structure according to Example 1-1 thermally treated at 400° C. for 1 hour, and FIG. 8 illustrates magnetic hysteresis curves dependent upon a silicon content (0 at % to 10.6 at %) in a spin-orbit active layer when a magnetic field was applied in an in-plane direction of a thin film;

FIG. 9 illustrates magnetic hysteresis curves dependent upon a silicon content (0 at % to 10.6 at %) in a spin-orbit active layer when a magnetic field was applied in an out-of-plane direction of a thin film to the W—Si/CoFeB/MgO/Ta structure according to Example 1-1 thermally treated at 500° C. for 1 hour, and FIG. 10 illustrates magnetic hysteresis curves dependent upon a silicon content (0 at % to 10.6 at %) in a spin-orbit active layer when a magnetic field was applied in an in-plane direction of a thin film;

FIG. 11A illustrates a schematic diagram of the W—Si/CoFeB/MgO/Ta structure according to Example 1-2 having PMA, and FIG. 11B illustrates the spin orbital torque efficiency of the W—Si/CoFeB/MgO/Ta structure according to Example 1-2 having PMA, shown in FIG. 11A, measured using a harmonic Hall voltage measurement method in a tungsten-silicon alloy layer composition range after performing vacuum thermal treatment at 300° C. and 500° C. for 1 hour;

FIG. 12 illustrates longitudinal electrical resistivity of the alloy in the W—Si/CoFeB/MgO/Ta structure according to Example 1-2 having PMA shown in FIG. 11A measured using a four-point probe in a tungsten-silicon alloy layer composition range after performing thermal treatment at 300° C. and 500° C. for 1 hour;

FIG. 13 illustrates switching characteristics dependent upon a tungsten-silicon alloy layer composition (unit: at %) when an external magnetic field of +100 Oe is applied to the W—Si/CoFeB/MgO/Ta structure according to Example 1-3 having PMA after performing vacuum thermal treatment at 300° C. for 1 hour, and FIG. 14 illustrates switching characteristics dependent upon a tungsten-silicon alloy layer composition (unit: at %) when an external magnetic field of −100 Oe is applied;

FIG. 15 illustrates switching characteristics dependent upon a tungsten-silicon alloy layer composition (unit: at %) when an external magnetic field of +100 Oe is applied to the W—Si/CoFeB/MgO/Ta structure according to Example 1-3 having PMA after performing vacuum thermal treatment at 500° C. for 1 hour, and FIG. 16 illustrates switching characteristics dependent upon a tungsten-silicon alloy layer composition (unit: at %) when an external magnetic field of −100 Oe is applied;

FIG. 17A illustrates a schematic diagram of the W—Si/CoFeB/MgO/Ta structure according to Example 1-3 having PMA, and FIG. 17B illustrates a switching current density change dependent upon the composition of the tungsten-silicon alloy layer as a spin-orbit active layer when an external magnetic field of ±100 Oe is applied to the W—Si/CoFeB/MgO/Ta structure according to Example 1-1 having PMA after performing vacuum thermal treatment for 1 hour at 300° C. and 500° C.;

FIG. 18 illustrates a switching current (current density) according to a change in an external magnetic field after thermally treating the W—Si/CoFeB/MgO/Ta structure according to Example 1-3, which includes a spin-orbit active layer in which a silicon content is 0 at %, at 300° C. for 1 hour, FIG. 19 illustrates a switching current (current density) according to a change in an external magnetic field after thermally treating the W—Si/CoFeB/MgO/Ta structure according to Example 1-3, which includes a spin-orbit active layer in which a silicon content is 7.4 at %, at 300° C. for 1 hour, and FIG. 20 illustrates a switching current (current density) according to a change in an external magnetic field after thermally treating the W—Si/CoFeB/MgO/Ta structure according to Example 1-3, which includes a spin-orbit active layer in which a silicon content is 9.1 at %, at 300° C. for 1 hour;

FIG. 21 illustrates a switching current (current density) according to a change in an external magnetic field after thermally treating the W—Si/CoFeB/MgO/Ta structure according to Example 1-3, which includes a spin-orbit active layer in which a silicon content is 0 at %, at 500° C. for 1 hour, FIG. 22 illustrates a switching current (current density) according to a change in an external magnetic field after thermally treating the W—Si/CoFeB/MgO/Ta structure according to Example 1-3, which includes a spin-orbit active layer in which a silicon content is 7.4 at %, at 500° C. for 1 hour, and FIG. 23 illustrates a switching current (current density) according to a change in an external magnetic field after thermally treating the W—Si/CoFeB/MgO/Ta structure according to Example 1-3, which includes a spin-orbit active layer in which a silicon content is 9.1 at %, at 500° C. for 1 hour;

FIG. 24 illustrates a Si content in W using Rutherford backscattering after performing vacuum thermal treatment for the W—Si/CoFeB/MgO/Ta structure according to Example 2, in which a silicon composition in the tungsten-silicon alloy layer is 3.0 at %, at 500° C. for 1 hour, FIG. 25 illustrates a Si content in W using Rutherford backscattering after performing vacuum thermal treatment for the W—Si/CoFeB/MgO/Ta structure according to Example 2, in which a silicon composition in the tungsten-silicon alloy layer is 4.0 at %, at 500° C. for 1 hour, FIG. 26 illustrates a Si content in W using Rutherford backscattering after performing vacuum thermal treatment for the W—Si/CoFeB/MgO/Ta structure according to Example 2, in which a silicon composition in the tungsten-silicon alloy layer is 7.4 at %, at 500° C. for 1 hour, and FIG. 27 illustrates a Si content in W using Rutherford backscattering after performing vacuum thermal treatment for the W—Si/CoFeB/MgO/Ta structure according to Example 2, in which a silicon composition in the tungsten-silicon alloy layer is 9.1 at %, at 500° C. for 1 hour;

FIG. 28 illustrates a schematic diagram of the CoFeB/W-Si/CoFeB/MgO/Ta structure according to Example 3 having PMA, FIG. 29 illustrates magnetic hysteresis curves when a magnetic field was applied in an out-of-plane direction of a thin film and in an in-plane direction of a thin film to the CoFeB/W-Si/CoFeB/MgO/Ta structure according to Example 3 after performing vacuum thermal treatment at 500° C. for 1 hour, and FIGS. 30 to 32 illustrate hysteresis curves of the magnetization reversal of a current-applied zero magnetic field;

FIG. 33 illustrates X-ray diffraction (XRD) results dependent upon a silicon composition (0.0 at %, 4.0 at %, 9.1 at %) in the tungsten-silicon alloy layer of the W—Si/CoFeB/MgO/Ta structure according to Example 1-1 having PMA after performing vacuum thermal treatment at 500° C. for 1 hour; and FIG. 34 illustrates thin film phases, obtained using an in-plane transmission electron microscope (TEM) of a thin film, dependent upon a silicon composition (0.0, 4.0, 9.1 at %) in the tungsten-silicon alloy layer of the W—Si/CoFeB/MgO/Ta structure according to Example 2 having PMA after performing vacuum thermal treatment at 300° C. for 1 hour, and FIG. 35 illustrates thin film phases, obtained using an in-plane transmission electron microscope (TEM) of a thin film, dependent upon a silicon composition (0.0, 4.0, 9.1 at %) of the tungsten-silicon alloy layer of the W—Si/CoFeB/MgO/Ta structure according to Example 2 having PMA after performing vacuum thermal treatment at 500° C. for 1 hour.

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components and steps, but do not preclude the presence or addition of one or more other components and/or steps thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

FIG. 1 illustrates a sectional view of a spin-orbit torque (SOT)-based magnetic tunnel junction according to an embodiment of the present disclosure.

The SOT-based magnetic tunnel junction according to an embodiment of the present disclosure includes a spin-orbit active layer 120 formed on a substrate 110, a free layer 130 formed on the spin-orbit active layer 120, a tunnel barrier layer 140 formed on the free layer 130 and a pinned layer 150 formed on the tunnel barrier layer 140, wherein the spin-orbit active layer 120 includes a W—X alloy (where W is tungsten and X includes at least one of group IV semiconductors and group III-V semiconductors).

Accordingly, the spin-orbit torque-based magnetic tunnel junction according to an embodiment of the present disclosure uses a W—X alloy having high spin-orbit coupling as the spin-orbit active layer 120, thereby being capable of performing spin-orbit torque switching and having high spin-orbit torque efficiency even at low specific resistance.

The spin-orbit-based magnetic tunnel junction according to an embodiment of the present disclosure includes the spin-orbit active layer 120 formed on the substrate 110.

The substrate 110 may include a semiconductor substrate. The semiconductor substrate may include silicon (Si), silicon-on-insulator (SOI), silicon germanium (SiGe), germanium (Ge), gallium arsenide (GaAs), etc.

A surface, which is contact with the spin-orbit active layer 120 (same meaning as spin torque active layer), of the substrate 110 may include a native oxide layer. The native oxide layer formed on a surface of the substrate 110 may be amorphous.

According to an embodiment, at least one of a seed layer and a buffer layer may be further included on the substrate 110.

Accordingly, the seed layer and the buffer layer may be formed between the substrate 110 and the spin-orbit active layer 120.

The seed layer may be formed on the substrate 110 and on the spin-orbit active layer 120. A seed layer is a material that enables crystal growth and allows a magnetic material to grow in a desired crystal direction.

The seed layer may include at least one of tantalum (Ta), ruthenium (Ru), titanium (Ti), palladium (Pd), platinum (Pt), magnesium (Mg), cobalt (Co), aluminum (Al) and tungsten (W), but is not limited thereto. Preferably, the seed layer may be a Ta layer having a thickness of 5 nm.

The buffer layer may be formed under the spin-orbit active layer 120. The buffer layer formed under the spin-orbit active layer 120 may increase the crystallinity of the spin-orbit active layer 120.

In addition, the buffer layer may be provided to resolve lattice constant mismatch among layers.

In addition, the seed layer and the buffer layer may be formed as a single layer without being separated from each other. For example, the buffer layer may also function as a seed layer.

The buffer layer may include at least one of Ta, W and Pd, but is not limited thereto. Preferably, the buffer layer may be a Pd layer having a thickness of 10 nm or a Ta layer having a thickness of 2 nm.

The spin-orbit active layer 120 may be brought into contact with the free layer 130, thereby being used as an electrode to provide in-plane current, and may provide in-plane current, thereby causing the spin Hall effect or the Rashba effect.

The spin-orbit active layer 120 may provide spin-polarized current and may induce the magnetic reversal of the free layer 130 by applying spin-orbit torque to the free layer 130 due to the spin Hall effect or the Rashba effect of the spin-orbit active layer 120. In addition, the spin-orbit active layer 120 may provide the free layer 130 with spin accumulation aligned in a magnetization direction of the spin-orbit active layer 120. Here, the spin accumulation may provide a deterministic switching effect or additional torque.

In addition, current driven in a plane through the spin-orbit active layer 120 and the accompanying spin orbit interactions may cause a spin orbit magnetic field (H). The spin orbit magnetic field (H) is equal to spin-orbit torque (T) on magnetization. Accordingly, torque and a magnetic field may be interchangeably referred to as a spin orbit magnetic field and spin-orbit torque. This reflects the fact that a spin orbit interaction is the source of spin-orbit torque and a spin orbit magnetic field. Spin-orbit torque may be generated by current and a spin orbit interaction driven in the plane of the spin-orbit active layer 120.

The spin-orbit active layer 120 may be an electrode that has a strong spin-orbit interaction and is used during magnetic moment switching of the free layer 130.

In addition, the spin-orbit active layer 120 may facilitate switching of a magnetic field in the free layer 130, and the spin-orbit active layer 120 may change a polarity direction of the magnetic field in the free layer 130 to implement a spin transfer torque memory.

Accordingly, the spin-orbit torque-based magnetic tunnel junction according to an embodiment of the present disclosure may use spin-orbit torque (SOT) to switch the free layer 130 using spin current to operate an MRAM memory cell.

The spin-orbit torque-based magnetic tunnel junction according to an embodiment of the present disclosure may use a W—X alloy (where W is tungsten and X includes at least one of group IV semiconductors and group III-V semiconductors) as the spin-orbit active layer 120. Accordingly, perpendicular magnetic anisotropy (PMA) may be maintained in various thermal treatment temperature ranges.

Preferably, the group IV semiconductor may include at least one of carbon (C), silicon (Si), germanium (Ge), tin (Sn) and an alloy thereof, and the group III-V semiconductor may include at least one of GaAs, GaP, InP, InGaAlN and GaN, without being limited thereto.

Preferably, the spin-orbit torque-based magnetic tunnel junction according to an embodiment of the present disclosure may use a tungsten (W)-silicon (Si) alloy as the spin-orbit active layer 120.

More particularly, the spin-orbit torque (SOT) is represented by the spin Hall effect and the Rashba effect caused by spin orbital interaction. Such a phenomenon may strongly appear in proportion to the atomic number. Accordingly, studies focusing on heavy metal materials (W, Ta, Pt, etc.) have been conducted, and studies, such as alloying or insertion of various materials, to further improve the properties and efficiency of a single heavy metal material are being conducted.

Accordingly, from the spintronics view point, tungsten has strong spin-Hall effect due to the spin-orbit interaction because tungsten is a material with excellent spin-orbit torque (SOT) expression, making it easy to use as a SOT-MRAM material. In addition, since the spin Hall effect and the Rashba effect which are known as the cause of the spin-orbit torque are present in X (Group 4 such as Si, Ge, Group 3-5 such as Ga—As, etc.) semiconductor materials, spin orbit torque switching is possible and high spin-orbit torque efficiency may be achieved even at low specific resistance when a WX alloy is used as the spin-orbit active layer 120.

Preferably, a W—Si alloy may be used as the spin-orbit active layer 120 because tungsten (W) and silicon (Si) are essential materials for a semiconductor process and, a W—Si alloy is also a very suitable material for a semiconductor process due to low contact resistance when thermally treated at high temperature.

The X element included in the spin-orbit active layer 120 of the spin-orbit torque-based magnetic tunnel junction according to an embodiment of the present disclosure is a semiconductor material and may exhibit extrinsic spin Hall effect.

Accordingly, as the content of X (e.g., silicon) in tungsten increases due to the extrinsic spin Hall effect of X which is partially present as an impurity inside tungsten, Spin Hall angle called the spin-orbit torque efficiency may increase.

In addition, as electron scattering increases due to X partially present as an impurity inside tungsten, and thus, the content of X in tungsten increases, the specific resistance of a W—X alloy thin film may increase.

Switching current of the spin-orbit torque-based magnetic tunnel junction according to an embodiment of the present disclosure may be decreased as the content of X included in a W—X alloy increases.

A switching current by spin-orbit torque (SOT) may be calculated by Equation 1 below.

$$I_{sw}^{SO} = \frac{2e}{\hbar\theta_{SH}} M_S t_{FM} A_{NM} \left( \frac{H_{k,eff}}{2} - \frac{H_x}{\sqrt{2}} \right) \quad \text{[Equation 1]}$$

wherein $I_{SW}^{SO}$ a denotes a switching current due to spin-orbit torque, $\theta_{SH}$ denotes the efficiency of spin torque called as Spin Hall angle, $M_S$ denotes saturation magnetization, $t_{FM}$ denotes the thickness of a magnetic layer, $A_{NM}$ denotes the cross-sectional area of a non-magnetic layer to which current is applied, $H_{k,eff}$ denotes the magnitude of a uniaxial anisotropic magnetic field, and $H_x$ denotes the magnitude of an external magnetic field required for a switching experiment.

As the content of X in the W—X alloy increases, a spin torque efficiency, $\theta_{SH}$, increases, and the magnitude, $H_{k,eff}$, of a uniaxial anisotropic magnetic field is decreased, so that switching current may be decreased.

In addition, the content of X included in the W—X alloy may be 0.1 at % to 10.6 at %. However, the content of X in the W—X alloy is not limited to the range and may be controlled depending upon the type of X.

As the content of X in the W—X alloy increases, PMA may be weakened. In addition, when the content of X in the W—X alloy is outside a specific content (e.g., 10.6 at %) range, PMA may be lost.

Preferably, the composition of X in the W—X alloy may be controlled according to a thermal treatment temperature. When the thermal treatment temperature is 300° C. or 400° C. and the composition of X is 0.1 at % to 9.6 at %, PMA may be exhibited. When the thermal treatment temperature is 500° C. and the composition of X is 0.1 at % to 8.6 at %, PMA may be exhibited. However, the content of X in the W—X alloy according to a thermal treatment temperature is not limited to the ranges, and may be adjusted depending upon the type of X.

When the content of X in the W—X alloy is less than 0.1 at %, this is the same as the case of composed of 100 at % of tungsten, which corresponds to an existing tungsten-based spin-orbit torque material excluding X. Accordingly, a spin-orbit torque efficiency may be decreased.

When the thermal treatment temperature is 300° C. or 400° C. and the content of X in the W—X alloy exceeds 9.6 at %, PMA may be lost, and the magnetic properties of magnetic layers (free layer and pinned layer) formed on a W—X alloy thin film may be lost. Accordingly, it may not be used as a magnetic tunnel junction element.

In addition, when the thermal treatment temperature is 500° C. and the content of X in the W—X alloy exceeds 8.6 at %, PMA may be lost, and the magnetic properties of magnetic layers (free layer and pinned layer) formed on a W—X alloy thin film may be lost. Accordingly, it may not be used as a magnetic tunnel junction element.

For example, when a tungsten (W)-silicon (Si) alloy is used as the spin-orbit active layer 120, a silicon composition ratio (x, where x is a real number) in which PMA exhibits may be 0.1 at % $\leq x \leq$ 9.6 at % when a thermal treatment temperature is 300° C., 0.1 at % $\leq x \leq$ 9.6 at % when a thermal treatment temperature is 400° C., and 0.1 at % $\leq x \leq$ 8.6 at % when a thermal treatment temperature is 500° C.

The switching current of the spin-orbit torque-based magnetic tunnel junction according to an embodiment of the present disclosure may be decreased as a thermal treatment temperature at which PMA is exhibited increases.

As the thermal treatment temperature of the spin-orbit torque-based magnetic tunnel junction according to an embodiment of the present disclosure increases, a spin torque efficiency, $\theta_{SH}$, may increases, and the magnitude, $H_{k,eff}$, of a uniaxial anisotropic magnetic field may be decreased, so that switching current may be decreased.

In addition, when the thermal treatment temperature is elevated, an X (e.g., silicon) atom partially present as an impurity inside tungsten is melted into the tungsten structure to be structurally stabilized while forming an intermetallic compound, so that specific resistance may be decreased.

A thermal treatment temperature at which PMA is exhibited may be 300° C. to 500° C.

Since a Back End Of Line (BEOL) process included in a semiconductor device process includes thermal treatment at 300° C. to 400° C., it is essential to develop an element capable of maintaining magnetic properties at such temperature.

Accordingly, since the spin-orbit torque-based magnetic tunnel junction having a CoFeB/MgO (free layer/tunnel barrier layer) structure according to an embodiment of the present disclosure should be thermally treated at at least 250° C. to 300° C. for PMA expression such that the crystallization of CoFeB (free layer) proceeds, thermal treatment should be performed at 300° C. or more. When the thermal treatment temperature is higher than 500° C., the temperature is outside a temperature range which CoFeB (free layer) utilized as a magnetic layer can withstand, so that the properties of the magnetic layer are lost.

The spin torque efficiency of the spin-orbit torque-based magnetic tunnel junction according to an embodiment of the present disclosure may be adjusted depending upon the thickness of the spin-orbit active layer 120. As the thickness of the spin-orbit active layer 120 increases from 1 nm, the spin torque efficiency increases and then is saturated. Accordingly, when the thickness of the spin-orbit active layer 120 is 5 nm to 7 nm, the maximum spin torque efficiency may be exhibited.

Preferably, since W may have an optimal thickness at 5 nm so as to maintain a beta phase having high spin torque efficiency, the spin-orbit active layer 120 may have a thickness of 5 nm.

The spin-orbit torque-based magnetic tunnel junction according to an embodiment of the present disclosure includes the free layer 130 to be formed on the spin-orbit active layer 120.

The magnetization of the free layer 130 may be changed from one direction to a direction opposite thereto without being fixed to one direction. The free layer 130 may have the same magnetization direction (i.e., parallel direction) as the pinned layer 150 or an opposite direction (i.e., antiparallel direction) thereto.

The magnetic tunnel junction may be used as a memory device by matching information to resistance values that change according to the magnetization arrangement of the free layer 130 and the pinned layer 150.

For example, when the magnetization direction of the free layer 130 is parallel to that of the pinned layer 150, the resistance value of the magnetic tunnel junction is decreased. This case may be defined as data '0'. In addition, when the magnetization direction of the free layer 130 is antiparallel to that of the pinned layer 150, the resistance value of the magnetic tunnel junction increases. This case may be defined as data '1'.

In the spin-orbit torque-based magnetic tunnel junction according to an embodiment of the present disclosure, the free layer 130 may have PMA.

For example, when the magnetization direction of the free layer 130 is a negative z-axis direction, the rotation direction of current may be clockwise so as to reverse the magnetization in a positive z-axis direction. Torque that is caused by in-plane current and applied to the magnetic moment of the free layer 130 may be referred to as spin-orbit torque.

The free layer 130 may include a material having interface perpendicular magnetic anisotropy (PMA). Interface PMA refers to a phenomenon wherein a magnetic layer having intrinsic horizontal magnetization characteristics has a perpendicular magnetization direction due to influence from an interface between another layer adjacent thereto.

The free layer 130 may include at least one of cobalt (Co), iron (Fe), and nickel (Ni). In addition, the free layer 130 may further include at least one of non-magnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

For example, the free layer 130 may include CoFe or NiFe, and may further include boron (B). Additionally, a free layer 130 and a pinned layer 150 may further include at least one of titanium (Ti), aluminum (Al), silicon (Si), magnesium (Mg), tantalum (Ta) and silicon (Si).

According to an embodiment, the free layer 130 may include at least one of materials having an L10 crystal structure, materials having a hexagonal close packed lattice (HCP), and amorphous rare-earth transition metal (RE-TM) alloys.

To exhibit perpendicular magnetic anisotropy, the thickness of the free layer 130 may be 0.9 nm, but is not limited thereto.

The spin-orbit torque-based magnetic tunnel junction according to an embodiment of the present disclosure includes the tunnel barrier layer 140 to be formed on the free layer 130.

The tunnel barrier layer 140 separates the free layer 130 and the pinned layer 150 from each other and enables quantum mechanical tunneling between the free layer 130 and the pinned layer 150.

The tunnel barrier layer 140 may be interposed between the free layer 130 and the pinned layer 150. The tunnel barrier layer 140 may include at least one of an oxide of magnesium (Mg), an oxide of titanium (Ti), an oxide of aluminum (Al), an oxide of magnesium-zinc (MgZn), an oxide of magnesium-boron (MgB), a nitride of titanium (Ti), and a nitride of vanadium (V). For example, the tunnel barrier layer 140 may include crystalline magnesium oxide (MgO).

To exhibit perpendicular magnetic anisotropy, the thickness of the tunnel barrier layer 140 may be 1.0 nm, but is not limited thereto.

The spin-orbit torque-based magnetic tunnel junction according to an embodiment of the present disclosure includes the pinned layer 150 to be formed on the tunnel barrier layer 140.

The pinned layer 150 may have a fixed magnetic moment during a write operation of a magnetic memory device. For example, the magnetic moment of the pinned layer 150 may not be switched due to spin-orbit torque caused by currents flowing through the spin-orbit active layer 120.

The pinned layer 150 may include a material having interface PMA.

Interface PMA refers to a phenomenon wherein a magnetic layer having intrinsic horizontal magnetization characteristics has a perpendicular magnetization direction due to influence from an interface between the magnetic layer and another layer adjacent thereto. The pinned layer 150 may include at least one of cobalt (Co), iron (Fe), and nickel (Ni).

In addition, the pinned layer 150 may further include at least one of non-magnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N).

For example, the pinned layer 150 may include CoFe or NiFe, and may further include boron (B). In addition, the pinned layer 150 and the free layer 130 may further include at least one of titanium (Ti), aluminum (Al), silicon (Si), magnesium (Mg), tantalum (Ta) and silicon (Si).

The pinned layer 150 may have a single layer structure. According to an embodiment, the pinned layer 150 may include a synthetic antiferromagnetic substance having ferromagnetic layers separated by nonmagnetic layer(s).

According to an embodiment, the pinned layer 150 may include at least one of materials having an L10 crystal structure, materials having a hexagonal close packed lattice (HCP), and amorphous RE-TM alloys.

The pinned layer 150 may be formed to be thicker than the free layer 130 so that switching does not easily occur.

The spin-orbit torque-based magnetic tunnel junction may further include a capping layer 160 to be formed on the pinned layer 150. Preferably, Ta may be used in the capping layer 160.

The capping layer 160 may be used as an anti-oxidation layer, and may be deposited to a thickness of 2 nm to prevent the properties of magnetic layers (free layer and pinned layer) from being reduced by natural oxidation.

When the thickness of the capping layer 160 is thicker than 2 nm, anti-oxidation effect may be increased, but the tunnel barrier layer 140 may be affected during deposition of the capping layer 160. Accordingly, perpendicular magnetic anisotropy conditions (the thicknesses of the free layer 130 and the tunnel barrier layer 140) should be controlled.

The spin-orbit active layer 120, the free layer 130, the tunnel barrier layer 140 and the pinned layer 150 of the spin-orbit torque-based magnetic tunnel junction according to an embodiment of the present disclosure may have a cross shape in plan view.

In addition, the spin-orbit active layer 120 of the spin-orbit torque-based magnetic tunnel junction according to an embodiment of the present disclosure may have a cross shape in plan view, and the free layer 130, the tunnel barrier layer 140 and the pinned layer 150 may be disposed in the form of an island in the center of the spin-orbit active layer 120 having a cross shape.

Referring to FIG. 2, the spin-orbit torque-based magnetic tunnel junction according to an embodiment of the present disclosure wherein the spin-orbit active layer 120 has a cross shape in plan view, and the free layer 130, the tunnel barrier layer 140 and the pinned layer 150 are arranged in the form of an island in the center of the spin-orbit active layer 120 having a cross shape is described in detail.

The spin-orbit torque-based magnetic tunnel junction electrically measures resistance changes according to the magnetization directions of the magnetic layers. When all the layers have a cross shape (the spin-orbit active layer 120, the free layer 130, the tunnel barrier layer 140 and the pinned layer 150 have a cross shape in plan view), the volume of the magnetic layers increases, and thus, signals are well displayed, which facilitates property analysis.

On the other hand, when the spin-orbit active layer 120 has a cross shape in plan view, and the free layer 130 and the tunnel barrier layer 140 and the pinned layer 150 are arranged in the form of an island in the center of the spin-orbit active layer 120 having a cross shape, this is only utilized upon switching using spin-orbit torque. At this time, the magnetization direction of a free layer may be prevented from being changed by domain wall propagation, not spin-orbit torque, and magnetization reversal due to only spin-orbit torque may be observed.

In addition, when the free layer 130, the tunnel barrier layer 140 and the pinned layer 150 are arranged in the form of an island, an etching step should be performed once more after fabricating all the layers in a cross shape. When the spin-orbit active layer begins to be exposed during etching, the etching should be immediately stopped. Accordingly, know-how in device fabrication is required.

FIG. 2 illustrates a plan view of a spin-orbit torque-based magnetic tunnel junction according to an embodiment of the present disclosure.

The spin-orbit active layer 120 having a cross shape may include a first conductive line 121 and a second conductive line 122. The first conductive line 121 and the second conductive line 122 may be formed to cross each other.

Accordingly, in the magnetization switching method, the free layer 130 may perform magnetization reversal by applying a first AC current jx having a first frequency to the first conductive line 121 and applying a second AC current jy having a first frequency to the second conductive line 122.

When a first current having a first angular frequency ω is injected to the first conductive line 121, and a second current having the first angular frequency ω is injected to the second conductive line 122, the total current vector at a position at which the free layer 130, the tunnel barrier layer 140 and the pinned layer 150 are disposed may rotate with time.

From the point of view of a rotating coordinate system like the phase of the total current vector, AC current turns into a problem of DC current. Meanwhile, from the standpoint of a rotating coordinate system, an effective magnetic field in a vertical direction corresponding to a rotational angular velocity appears. That is, the effect of AC current is converted to a problem of DC current in a system with an effective magnetic field in a vertical direction. In this case, the magnetization of a free layer may be very easily reversed due to the effect of the effective magnetic field in a vertical direction.

The first conductive line 121 and the second conductive line 122 may be formed of materials that induce the spin Hall effect or the Rashba effect. When the first current flows in the first conductive line 121, spin polarization perpendicular to a traveling direction of the first conductive line 121 occurs, and spin current travels in the free layer direction (z-axis direction).

The first conductive line 121 may have a line shape extending in an x-direction. The second conductive line 122 may have a line shape crossing the first conductive line 121. For example, the second conductive line 122 may have a line shape extending in a y-direction.

The first conductive line 121 and the second conductive line 122 may cross each other at a point and may be connected to each other. For example, the first conductive line 121 and the second conductive line 122 may be positioned in the same plane (i.e., x-y plane).

The spin-orbit torque-based magnetic tunnel junction according to an embodiment of the present disclosure may electrically measure characteristics due to the spin Hall effect by patterning the spin-orbit active layer 120 in a cross shape, and may measure the movement of magnetization by spin torque with voltage in a direction perpendicular to a current injection direction.

FIG. 3 is a flowchart illustrating a method of manufacturing a spin-orbit torque-based magnetic tunnel junction according to an embodiment of the present disclosure.

The method of manufacturing a spin-orbit torque-based magnetic tunnel junction according to an embodiment of the present disclosure includes the same components as the spin-orbit torque-based magnetic tunnel junction according to an embodiment of the present disclosure. Accordingly, description of the same components is omitted.

First, the method of fabricating a spin-orbit torque-based magnetic tunnel junction according to an embodiment of the present disclosure includes a step (S110) of forming a spin-orbit active layer on a substrate.

The substrate may be a silicon substrate, and a native oxide layer may be formed on a surface of the silicon substrate. According to an embodiment, the native oxide layer may be formed by CVD, PVD or thermal oxidation.

According to an embodiment, the method of fabricating a spin-orbit torque-based magnetic tunnel junction according to an embodiment of the present disclosure may include at least one of a step of forming a seed layer on the substrate and a step of forming a buffer layer on the substrate, before formation of the spin-orbit active layer on the substrate.

The seed layer and the buffer layer may be formed by physical vapor deposition (PVD) including sputtering, molecular beam epitaxy (MBE), pulsed laser deposition (PLD), atomic layer deposition (ALD), e-beam epitaxy, chemical vapor deposition (CVD), a derived CVD process such as low pressure CVD (LPCVD), ultrahigh vacuum CVD (UHVCVD) or reduced pressure CVD (RPCVD), electroplating, coating or any combination thereof.

In the step (S110) of forming a spin-orbit active layer on a substrate, W target and X target are simultaneously sputtered in a vacuum chamber to form a W—X alloy (where W is tungsten and X includes at least one of a group IV semiconductor and a group III-V semiconductor) thin film on a substrate disposed in the vacuum chamber.

Preferably, a tungsten-silicon alloy thin film may be formed on the substrate disposed in the vacuum chamber by co-deposition of simultaneously sputtering W target and X target in a vacuum chamber.

By the method of fabricating a spin-orbit torque-based magnetic tunnel junction according to an embodiment of the present disclosure, the composition of a W—X alloy thin film may be controlled according to the power and thickness of W target and X target.

First, the composition of the W—X alloy thin film may be adjusted according to the power of W target and X target.

The power of W target may be 0.1 W to 85 W (0 W/cm$^2$ to 4.19 W/cm$^2$). When the power of W target is less than 0.1 W, there is a problem that W is not deposited. When the power of W target is greater than 85 W, there is a problem that cracks are generated due to too high energy applied to W target.

The power of X target may be 0.1 W to 86.2 W (0.1 W/cm$^2$ to 4.25 W/cm$^2$). When the power of X target is less than 0.1 W, there is a problem that X is not deposited. When the power of X target is greater than 86.2 W, there is a problem that cracks are generated due to too high energy applied to X target.

For example, when the volumes (mol/cm$^3$) per mole are calculated using the physical properties (density, atomic weight) of the respective materials (W and X) and divided by the thickness to deposit to a specific thickness, the mole values of the respective materials (W and X) are calculated by calculating a deposited mole value, and then fixing the thickness of an entire W—X alloy thin film and adjusting the thicknesses of the respective materials (W and X). The composition of the W—X alloy thin film (at %) may be determined using the calculated mole values.

Assuming that the W target and X target power are in direct proportion to the deposition power and deposition rate of each of the targets, deposition may be performed with power at which the deposition time of both the materials are the same, using a deposition rate of 50 W (2.47 W/cm$^2$).

For example, when the W—Si alloy thin film is formed using silicon as X, the deposition rates of tungsten (W) and silicon (Si) are respectively 0.045778 nm/s and 0.013678 nm/s at a power of 50 W using sputtering equipment. Accordingly, when the thickness of the W—Si alloy thin film is fixed to 5 nm to match an atomic ratio of tungsten to silicon to 50:50, the thicknesses of tungsten and silicon may be 3.72 nm and 1.28 nm, respectively.

When both the materials are deposited at 50 W in consideration of deposition rates, it takes 81.3 seconds and 93.6 seconds to deposit respective thicknesses thereof. In this case, the W—Si alloy thin film is not uniformly formed due to differences in deposition time. Accordingly, the power of the respective materials may be adjusted and set such that it takes the same time to deposit tungsten to a thickness of 3.72 nm and to deposit silicon to a thickness of 1.28 nm, followed by performing deposition.

Here, the power of the tungsten target may be 60 W (2.96 W/cm$^2$), and the power of the silicon target may be 69.1 W (3.41 W/cm$^2$).

In addition, when the thickness of the W—Si alloy thin film is 5 nm, the thickness of tungsten may be 1.2 nm to 4.9 nm, and the thickness of silicon may be 0.1 nm to 3.8 nm.

In addition, the deposition time during which the tungsten target and the silicon target are simultaneously sputtered may be 59 seconds to 231 seconds.

An initial vacuum degree of a sputtering chamber may be 5×10$^{-9}$ Torr. When 39 sccm of argon is flowed into the sputtering chamber, a working pressure may be 1.4 mTorr.

Accordingly, the content of X included in the W—X alloy may be 0.1 at % to 10.6 at %.

For example, when a tungsten (W)-silicon (Si) alloy is used as a W—X alloy, PMA may be exhibited in a silicon composition ratio (x, where x is a real number) of 0.1 at %≤x≤9.6 at % when a thermal treatment temperature is 300° C., in a silicon composition ratio (x) of 0.1 at %≤x≤9.6 at % when a thermal treatment temperature is 400° C., and in a silicon composition ratio (x) of 0.1 at %≤x≤8.6 at % when a thermal treatment temperature is 500° C.

The step of forming a spin-orbit active layer on the substrate may further include a step of patterning the W—X alloy thin film in a cross shape.

The W—X alloy thin film may be patterned in a cross shape by performing photolithography and etching.

The method of fabricating a spin-orbit torque-based magnetic tunnel junction according to an embodiment of the present disclosure includes a step (S120) of forming a free layer on the spin-orbit active layer, a step (S130) of forming a tunnel barrier layer on the free layer, and a step (S140) of forming a pinned layer on the tunnel barrier layer.

Each of the free layer, the tunnel barrier layer and the pinned layer may be formed by physical vapor deposition (PVD) including sputtering, molecular beam epitaxy (MBE), pulsed laser deposition (PLD), atomic layer deposition (ALD), e-beam epitaxy, chemical vapor deposition (CVD), a derived CVD process such as low pressure CVD (LPCVD), ultrahigh vacuum CVD (UHVCVD) or reduced pressure CVD (RPCVD), electroplating, or any combination thereof.

According to an embodiment, the method of fabricating a spin-orbit torque-based magnetic tunnel junction according to an embodiment of the present disclosure may include, after the step (S140) of forming a pinned layer on the tunnel barrier layer, a step of forming a capping layer on the pinned layer.

The capping layer may be formed by physical vapor deposition (PVD) including sputtering, molecular beam epitaxy (MBE), pulsed laser deposition (PLD), atomic layer deposition (ALD), e-beam epitaxy, chemical vapor deposition (CVD), a derived CVD process such as low pressure CVD (LPCVD), ultrahigh vacuum CVD (UHVCVD) or reduced pressure CVD (RPCVD), electroplating, coating or any combination thereof.

A step (S150) of thermally treating the free layer and the pinned layer to exhibit PMA is performed.

The method of fabricating a spin-orbit torque-based magnetic tunnel junction according to an embodiment of the present disclosure includes the step (S150) of thermally treating the free layer and the pinned layer to exhibit PMA.

By the method of fabricating a spin-orbit torque-based magnetic tunnel junction according to an embodiment of the present disclosure, the spin torque efficiency, $\theta_{SH}$, may increase and the magnitude, $H_{k,eff}$, of a uniaxial anisotropic magnetic field may be decreased as the thermal treatment temperature is elevated, so that switching current may be decreased.

In addition, when the thermal treatment temperature is elevated, an X (e.g., silicon) atom partially present as an impurity inside tungsten is melted into the tungsten structure to be structurally stabilized while forming an intermetallic compound, so that specific resistance may be decreased.

A thermal treatment temperature at which PMA is exhibited may be 300° C. to 500° C.

Since a Back End Of Line (BEOL) process included in a semiconductor device process includes thermal treatment at 300° C. to 400° C., it is essential to develop an element capable of maintaining magnetic properties also at the temperature.

Accordingly, since the method of fabricating the spin-orbit torque-based magnetic tunnel junction having a CoFeB/MgO (free layer/tunnel barrier layer) structure according to an embodiment of the present disclosure should include thermally treating at least 250° C. to 300° C. for PMA expression such that the crystallization of CoFeB (free layer) proceeds, thermal treatment should be performed at 300° C. or more. When the thermal treatment temperature is higher than 500° C., the temperature is outside a temperature range in which CoFeB (free layer) utilized as a magnetic layer can withstand, so that the properties of the magnetic layer are lost.

Experimental Example 1: Device Fabrication

[Example 1-1]: Si/SiO$_2$/W-Si/CoFeB/MgO/Ta (Multilayer Thin Film Structure) Fabrication On a Si substrate (Si/SiO$_2$) on which an amorphous native oxide layer has been formed, a silicon (Si) target was simultaneously sputtered while sputtering a tungsten (W) target, thereby forming a tungsten-silicon alloy layer (W—Si, spin-orbit active layer) having a thickness of 5 nm. Here, the tungsten target and the silicon target were respectively sputtered using DC and AC magnetron, the composition of a tungsten-based alloy thin film was controlled by adjusting the respective sputtering power of the elements sputtered simultaneously in the state in which the flow rate of argon gas was fixed, and the size of a target used to fabricate a tungsten-silicon alloy layer was 2 inches in diameter.

A CoFeB free layer was formed to a thickness of 0.9 nm on the tungsten-silicon alloy layer using a Co$_{40}$Fe$_{40}$B$_{20}$ (at %) target, and then a 1 nm MgO insulating layer and a 2 nm Ta capping layer were formed thereon.

As a result, Si/SiO$_2$/W-Si/CoFeB/MgO/Ta (substrate/native oxide layer/spin-orbit active layer/free layer/tunnel barrier/capping layer) was formed as shown in FIG. 4.

To fabricate a spin-orbit torque-based magnetic tunnel junction, DC magnetron sputtering was used to laminate a metal layer, AC magnetron sputtering was used to laminate an insulator, a base pressure was respectively 5×10$^{-9}$ Torr or less, and deposition was performed under argon (Ar) atmosphere. The thickness of each layer was adjusted using a deposition time and sputtering power.

FIG. 4 illustrates a sectional view of a structure for measuring the spin-orbit torque efficiency of a spin-orbit torque-based magnetic tunnel junction according to an embodiment of the present disclosure.

[Example 1-2]: Si/SiO$_2$/W-Si/CoFeB/MgO/Ta (Cross Pattern Structure) Fabrication A multilayer thin film structure including a spin-orbit active layer, a CoFeB free layer and a MgO insulating layer was fabricated in the same manner as in Example 1-1. The entire structure of the device was patterned in a cross shape as shown in FIG. 11A, and the spin orbit torque efficiency and specific resistance thereof were measured.

[Example 1-3]: Si/SiO$_2$/W-Si/CoFeB/MgO/Ta (Free Layer, Magnetic Tunnel Junction Structure) Fabrication A multilayer thin film structure including a spin-orbit active layer, a CoFeB free layer and a MgO insulating layer was fabricated in the same manner as in Example 1-1. As shown in FIG. 17A, the entire structure of the device was patterned in a cross shape, and then all layers, except for a spin-orbit active layer, were formed in the form of an island on a spin-orbit torque active layer. A produced specimen was subjected to measurement of magnetization reversal due to current-applied spin orbital torque.

Example 2

A single 25 nm tungsten-silicon alloy layer (W—Si, spin-orbit active layer) was formed, and a structure was fabricated in the same manner as in Example 1-1, except that a patterning process.

[Example 3]: CoFeB 4/W$_{96}$Si$_{4.0}$ 1.5/CoFeB 0.9/MgO 1/Ta 2 (unit: nm)

On a Si substrate (Si/SiO$_2$) on which an amorphous native oxide layer had been formed, a 4 nm magnetic layer having an easy magnetization axis in an in-plane direction was deposited using Co$_{40}$Fe$_{40}$B$_{20}$ (at %) target and DC magnetron sputtering. Here, the thickness of the magnetic layer may be changed in a state in which an easy magnetization axis is in an in-plane direction.

A silicon (Si) target was simultaneously sputtered while sputtering a tungsten (W) target, thereby forming a tungsten-silicon alloy layer (W—Si, spin-orbit active layer) having a thickness of 1.5 nm. Here, the tungsten target and the silicon target were respectively sputtered using DC and AC magnetron, the composition of a tungsten-based alloy thin film was controlled by adjusting the respective sputtering power of the elements sputtered simultaneously in the state in which the flow rate of argon gas was fixed, and the size of a target used to fabricate a tungsten-silicon alloy layer was 2 inches in diameter. The thickness of the tungsten-silicon alloy layer may also be changed (thickness: 1 nm, 1.5 nm, 2 nm, 3 nm).

A CoFeB free layer was formed to a thickness of 0.9 nm on the tungsten-silicon alloy layer using a Co$_{40}$Fe$_{40}$B$_{20}$ (at %) target, and then a 1 nm MgO insulating layer and a 2 nm Ta capping layer were formed thereon.

As a result, Si/SiO$_2$/CoFeB/W-Si/CoFeB/MgO/Ta (substrate/magnetic layer having an easy magnetization axis in an in-plane direction/native oxide layer/spin-orbit active layer/free layer/tunnel barrier/capping layer) similar to that shown in FIG. 4, but including CoFeB formed between SiO$_2$ and W—Si was formed.

To fabricate a spin-orbit torque-based magnetic tunnel junction, DC magnetron sputtering was used to laminate a metal layer, AC magnetron sputtering was used to laminate an insulator, a base pressure was respectively $5 \times 10^{-9}$ Torr or less, and deposition was performed under argon (Ar) atmosphere. The thickness of each layer was adjusted using a deposition time and sputtering power.

As in Example 1-2 of the present disclosure, the entire thin film structure was patterned in a cross pattern shape to measure the spin-orbit torque efficiency of the spin-orbit torque-based magnetic tunnel junction.

Next, to measure magnetization reversal due to current-applied spin orbital torque, all layers, except for a spin-orbit active layer, were formed in the form of an island on the spin-orbit active layer as in Example 1-3.

[Experimental Example 4]: Thermal Treatment

After forming all of Si/SiO$_2$/W—Si/CoFeB/MgO/Ta as shown in FIG. 4, thermal treatment was performed at 300° C., 400° C. and 500° C. for 1 hour. A base pressure during the thermal treatment was in a 10$^{-6}$ Torr band, and an external magnetic field of 6 kOe was applied in a direction perpendicular to Si/SiO$_2$/W—Si/CoFeB/MgO/Ta (spin-orbit torque-based magnetic tunnel junction) during the thermal treatment.

After performing thermal treatment at 300° C., 400° C. and 500° C., a cross-shaped Hall bar having a size of 5×35 μm$^2$ was fabricated by photolithography to investigate the spin orbital torque efficiency of a specimen maintaining PMA. After fabricating a cross-shaped Hall bar using the same specimen, a CoFeB/MgO/Ta layer was fabricated in the form of an island to have a diameter of 4 μm, and the magnetization reversal thereof due to spin-orbit torque was measured.

FIGS. 5 to 10 illustrate magnetic hysteresis curves dependent upon a thermal treatment temperature measured using a vibrating sample magnetometer (VSM).

FIG. 5 illustrates magnetic hysteresis curves dependent upon a silicon content (0 at % to 10.6 at %) in a spin-orbit active layer when a magnetic field was applied in an out-of-plane direction of a thin film to the spin-orbit torque-based magnetic tunnel junction according to an embodiment of the present disclosure (hereinafter referred to as W—Si/CoFeB/MgO/Ta structure according to Example 1-1), shown in FIG. 4, thermally treated at 300° C. for 1 hour, and FIG. 6 illustrates magnetic hysteresis curves dependent upon a silicon content (0 at % to 10.6 at %) in a spin-orbit active layer when a magnetic field was applied in an in-plane direction of a thin film.

FIGS. 5 and 6 illustrate magnetic hysteresis curves measured by applying a magnetic field in an out-of-plane direction of a thin film and in an in-plane direction of a thin film using a vibrating sample magnetometer (VSM).

Referring to FIGS. 5 and 6, it was confirmed that PMA was exhibited in silicon compositions from 0 at % to 10.6 at % when the thickness of the tungsten-silicon alloy in the W—Si/CoFeB/MgO/Ta structure according to Example 1-1 thermally treated at 300° C. was fixed to 5 nm.

FIG. 7 illustrates magnetic hysteresis curves dependent upon a silicon content (0 at % to 10.6 at %) in a spin-orbit active layer when a magnetic field was applied in an out-of-plane direction of a thin film to the W—Si/CoFeB/MgO/Ta structure according to Example 1-1 thermally treated at 400° C. for 1 hour, and FIG. 8 illustrates magnetic hysteresis curves dependent upon a silicon content (0 at % to 10.6 at %) in a spin-orbit active layer when a magnetic field was applied in an in-plane direction of a thin film.

Referring to FIGS. 7 and 8, it was confirmed that, when the thickness of the tungsten-silicon alloy in the W—Si/CoFeB/MgO/Ta structure according to Example 1-1 thermally treated at 400° C. was fixed to 5 nm, PMA was maintained in silicon compositions from 0 at % to 10.6 at %, but PMA disappeared at a higher silicon content.

In addition, in the silicon content range of 10.6 at % or more, anisotropy may not exhibit, and magnetic properties may be decreased as the content of silicon increases.

FIG. 9 illustrates magnetic hysteresis curves dependent upon a silicon content (0 at % to 10.6 at %) in a spin-orbit active layer when a magnetic field was applied in an out-of-plane direction of a thin film to the W—Si/CoFeB/MgO/Ta structure according to Example 1-1 thermally treated at 500° C. for 1 hour, and FIG. 10 illustrates magnetic hysteresis curves dependent upon a silicon content (0 at % to 10.6 at %) in a spin-orbit active layer when a magnetic field was applied in an in-plane direction of a thin film.

Referring to FIGS. 9 and 10, it was confirmed that, when the thickness of the tungsten-silicon alloy in the W—Si/CoFeB/MgO/Ta structure according to Example 1-1 thermally treated at 500° C. was fixed to 5 nm, PMA was maintained in silicon compositions from 0 at % to 10.6 at %, but PMA disappeared at a higher silicon content.

FIG. 11A illustrates a schematic diagram of the W—Si/CoFeB/MgO/Ta structure according to Example 1-2 having PMA, and FIG. 11B illustrates the spin orbital torque efficiency of the W—Si/CoFeB/MgO/Ta structure according to Example 1-2 having PMA, shown in FIG. 11A, measured using a harmonics measurement method in a tungsten-silicon alloy layer composition range after performing vacuum thermal treatment at 300° C. and 500° C. for 1 hour. Here, DL$_{WS3}$, FL$_{WS3}$, DL$_{WS5}$ and FL$_{WS5}$ denotes the damping-like torque of a specimen thermally treated at 300° C., the field-like torque of a specimen thermally treated at 300° C., the damping-like torque of a specimen thermally treated at 500° C., and the field-like torque efficiency of a specimen thermally treated at 500° C., respectively.

Referring to FIG. 11A, the W—Si/CoFeB/MgO layer according to Example 1-2 was patterned in a cross shape, and then measurement was performed using a harmonics measurement method.

When current flows through the multilayer thin film structure, fabricated by patterning the W—Si/CoFeB/MgO layer according to Example 1-2 in a cross shape, in an x-direction, voltage may be measured in x- and y-directions. The x-direction voltage may measure the specific resistance of a material, and the y-direction voltage may measure the spin orbit torque efficiency of a material.

Referring to FIG. 11B, it was confirmed that, when the tungsten-silicon alloy layer was thermally treated at 500° C., the spin orbit torque efficiency increased (30%) in all silicon compositions, compared to the case using a single tungsten layer.

In particular, it was confirmed that, when the composition of Si was 4.0 at %, the spin orbital torque efficiency was 0.58 increased by about 100% compared to the case of the single tungsten layer.

FIG. 12 illustrates electrical resistivity of the alloy in the W—Si/CoFeB/MgO/Ta structure according to Example 1-2 having PMA shown in FIG. 11A measured using a four-point probe in a tungsten-silicon alloy layer composition range after performing thermal treatment at 300° C. (WS3) and 500° C. (WS5) for 1 hour.

In FIG. 12, the W—Si layer was patterned in a cross shape, and then the electrical resistivity thereof was measured using a harmonics measurement method.

Based on the assumption that, when current passes through the W—Si/CoFeB/MgO/Ta structure, the current does not pass through the insulating layer (MgO) and the capping layer (Ta), the parallel resistance of each of the W—Si layer, as a spin-orbit active layer (electrode), and CoFeB (ρ=170 μΩ·cm), as a free layer was calculated to calculate the specific resistance of the tungsten-silicon alloy layer.

Referring to FIG. 12, it was confirmed that the specific resistance increased as the content of silicon increased under thermal treatment conditions of 300° C. and 500° C., but, when thermally treated at 500° C., the specific resistance in a silicon content of 7.6 at % or less was lower than the specific resistance of the single tungsten layer thermally treated at 300° C.

FIGS. 13 to 22 illustrate the switching characteristics of the W—Si/CoFeB/MgO/Ta structure according to Example 1-3. Layers (free layer, tunnel barrier, etc.) except for a spin torque active layer were patterned in the form of an island in the center of the spin-orbit active layer having a cross shape, followed by measurement.

FIG. 13 illustrates switching characteristics dependent upon a tungsten-silicon alloy layer composition (unit: at %) when an external magnetic field of +100 Oe is applied to the W—Si/CoFeB/MgO/Ta structure according to Example 1-3 having PMA after performing vacuum thermal treatment at 300° C. for 1 hour, and FIG. 14 illustrates switching characteristics dependent upon a tungsten-silicon alloy layer composition (unit: at %) when an external magnetic field of −100 Oe is applied.

Referring to FIGS. 13 and 14, it can be confirmed that, due to the spin-orbit torque switching characteristics dependent upon the composition of the tungsten-silicon alloy layer, switching occurs at smaller current, compared to the case of a single tungsten layer, in all of the silicon compositions.

FIG. 15 illustrates switching characteristics dependent upon a tungsten-silicon alloy layer composition (unit: at %) when an external magnetic field of +100 Oe is applied to the W—Si/CoFeB/MgO/Ta structure according to Example 1-3 having PMA after performing vacuum thermal treatment at 500° C. for 1 hour, and FIG. 16 illustrates switching characteristics dependent upon a tungsten-silicon alloy layer composition (unit: at %) when an external magnetic field of −100 Oe is applied.

Referring to FIGS. 15 and 16, it can be confirmed that, due to the spin-orbit torque switching characteristics dependent upon the composition of the tungsten-silicon alloy layer, switching occurs at smaller current, compared to the case of a single tungsten layer, in all of the silicon compositions.

FIG. 17A illustrates a schematic diagram of the W—Si/CoFeB/MgO/Ta structure according to Example 1-3 having PMA, and FIG. 17B illustrates a switching current density change dependent upon the composition of the tungsten-silicon alloy layer as a spin-orbit active layer when an external magnetic field of ±100 Oe is applied to the W—Si/CoFeB/MgO/Ta structure according to Example 1-1 having PMA after performing vacuum thermal treatment for 1 hour at 300° C. and 500° C.

The switching current density considered a specific resistance change according to an increase of the silicon content, and was calculated using the magnitude of current actually flowing through the tungsten-silicon alloy layer through parallel resistance calculation.

Referring to FIG. 17A, the W—Si layer was patterned in a cross shape, and then CoFeB/MgO was only formed at a cross-shaped intersection of the W—Si layer.

In the case of a multilayer thin film structure fabricated by patterning a W—Si layer in a cross shape, and then only forming CoFeB/MgO at a cross-shaped intersection of the W—Si layer, magnetization reversal due to spin orbit torque according to current injection may be observed when current is measured in an x-direction and voltage is measured in a y-direction. In addition, the magnetization reversal of an existing magnetic field may be measured when a magnetic field is applied in an x-direction to the same structure, and the magnetization reversal of a zero magnetic field may be measured when a magnetic field is not applied.

Referring to FIG. 17B, it can be confirmed that the switching current is decreased as the content of silicon increases.

More particularly, when thermal treatment was performed at 300° C. and silicon was not included, the switching current density was 43.5 MA/cm$^2$. However, when the composition of silicon (Si) was 9.6 at %, the switching current density was decreased up to 14.0 MA/cm$^2$.

When thermal treatment was performed at 500° C. and silicon was not included, the switching current density was 33.2 MA/cm$^2$. However, when the composition of silicon (Si) was 7.4 at %, the switching current density was decreased up to 10.8 MA/cm$^2$.

Accordingly, it was confirmed that when thermal treatment was performed at 500° C., the switching current density was lower, compared to the case in which thermal treatment was performed at 300° C., in all of the compositions.

FIG. 18 illustrates a switching current (current density) according to a change in an external magnetic field after thermally treating the W—Si/CoFeB/MgO/Ta structure according to Example 1-3, which includes a spin-orbit active layer in which a silicon content is 0 at %, at 300° C. for 1 hour, FIG. 19 illustrates a switching current (current density) according to a change in an external magnetic field after thermally treating the W—Si/CoFeB/MgO/Ta structure according to Example 1-3, which includes a spin-orbit active layer in which a silicon content is 7.4 at %, at 300° C. for 1 hour, and FIG. 20 illustrates a switching current (current density) according to a change in an external magnetic field after thermally treating the W—Si/CoFeB/MgO/Ta structure according to Example 1-3, which includes a spin-orbit active layer in which a silicon content is 9.1 at %, at 300° C. for 1 hour.

Referring to FIGS. 18 to 20, it can be confirmed that, as the magnitude of an external magnetic field increases from 10 Oe to 150 Oe, switching current or current density necessary for magnetization reversal is decreased, and spin-orbit torque switching occurs in all of the applied external magnetic fields.

FIG. 21 illustrates a switching current (current density) according to a change in an external magnetic field after thermally treating the W—Si/CoFeB/MgO/Ta structure according to Example 1-3, which includes a spin-orbit active layer in which a silicon content is 0 at %, at 500° C. for 1 hour, FIG. 22 illustrates a switching current (current density) according to a change in an external magnetic field after thermally treating the W—Si/CoFeB/MgO/Ta structure according to Example 1-3, which includes a spin-orbit active layer in which a silicon content is 7.4 at %, at 500° C. for 1 hour, and FIG. 23 illustrates a switching current (current density) according to a change in an external magnetic field after thermally treating the W—Si/CoFeB/MgO/Ta structure according to Example 1-3, which includes a spin-orbit active layer in which a silicon content is 9.1 at %, at 500° C. for 1 hour.

Referring to FIGS. 21 to 23, it can be confirmed that, as the magnitude of an external magnetic field increases from 10 Oe to 150 Oe, switching current or current density necessary for magnetization reversal is decreased.

In addition, it can be confirmed that spin-orbit torque switching occurs in all of the applied external magnetic fields and, compared to FIGS. 18 to 23, a switching current value is decreased as a thermal treatment temperature increases.

FIG. 24 illustrates a Si content in W using Rutherford backscattering after performing vacuum thermal treatment for the W—Si/CoFeB/MgO/Ta structure according to Example 2, in which a silicon composition in the tungsten-silicon alloy layer is 3.0 at %, at 500° C. for 1 hour, FIG. 25 illustrates a Si content in W using Rutherford backscattering after performing vacuum thermal treatment for the W—Si/CoFeB/MgO/Ta structure according to Example 2, in which a silicon composition in the tungsten-silicon alloy layer is 4.0 at %, at 500° C. for 1 hour, FIG. 26 illustrates a Si content in W using Rutherford backscattering after performing vacuum thermal treatment for the W—Si/CoFeB/MgO/Ta structure according to Example 2, in which a silicon composition in the tungsten-silicon alloy layer is 7.4 at %, at 500° C. for 1 hour, and FIG. 27 illustrates a Si content in W using Rutherford backscattering after performing vacuum thermal treatment for the W—Si/CoFeB/MgO/Ta structure according to Example 2, in which a silicon composition in the tungsten-silicon alloy layer is 9.1 at %, at 500° C. for 1 hour.

Referring to FIGS. 24 to 27, it can be confirmed that silicon compositions in the tungsten-silicon alloy layers are 3.0 at %, 4.0 at %, 7.4 at % and 9.1 at %.

FIG. 28 illustrates a schematic diagram of the CoFeB/W-Si/CoFeB/MgO/Ta structure according to Example 3 having PMA, FIG. 29 illustrates magnetic hysteresis curves when a magnetic field was applied in an out-of-plane direction of a thin film and in an in-plane direction of a thin film to the CoFeB/W-Si/CoFeB/MgO/Ta structure according to Example 3 after performing vacuum thermal treatment at 500° C. for 1 hour, and FIGS. 30 to 32 illustrate hysteresis curves of the magnetization reversal of a current-applied zero magnetic field.

Referring to FIG. 28, it can be confirmed that residual magnetization remains when a magnetic field is applied both in an out-of-plane direction of a thin film and an in-plane direction of a thin film, which indicates that an easy magnetization direction is present both in the directions (e.g., x-direction and y-direction).

In addition, in the case of the CoFeB/W-Si/CoFeB/MgO/Ta structure according to Example 3, a magnetic layer having an easy magnetization axis in an in-plane direction is deposited under a spin torque activation layer, so that the magnetization reversal of a zero magnetic field is possible, and characteristics may be controlled according to the thicknesses of the lower magnetic layer and the spin torque activation layer. Accordingly, it can be confirmed that, according to a design, the magnetic layer under the W—Si alloy layer has an easy magnetization axis in an in-plane direction, and an easy magnetization axis is present in a perpendicular direction to a back surface of the magnetic layer on the W—Si alloy layer.

FIGS. 30 and 31 respectively illustrate a magnetization reversal situation caused by spin-orbit torque in a state in which an external magnetic field is not applied when an initial magnetization direction of a magnetic layer present under a W—Si alloy layer is present in a −x or +x-direction. Referring to FIGS. 30 and 31, it can be confirmed that the initial magnetization of the lower magnetic layer determines a switching direction.

Referring to FIG. 32, it can be confirmed that magnetization reversal due to spin orbit torque when an external magnetic field is changed from −200 Oe to +200 Oe occurs even at an external magnetic field of 0 Oe. In addition, the switching direction is changed at +30 Oe because the magnetization direction of the lower magnetic layer is changed around 30 Oe. Here, 30 Oe means the coercive force of the lower magnetic layer.

FIG. 33 illustrates X-ray diffraction (XRD) results dependent upon a silicon composition (0.0 at %, 3.0 at %, 4.0 at %, 7.4 at %, 9.1 at %, 100 at %) in the tungsten-silicon alloy layer of the W—Si/CoFeB/MgO/Ta structure according to Example 1-1 having PMA after performing vacuum thermal treatment at 500° C. for 1 hour.

Data shown as bar graphs in the lower part of FIG. 33 is standard data, and each standard data code is indicated in the graph.

Referring to FIG. 33, it can be confirmed that, as a result of confirming the phases of tungsten-silicon alloy layers using X-ray diffraction analysis, a beta-W phase is maintained up to a silicon (Si) content of 7.4 at % or less (trident peak around 40 degrees), but, from 9.1 at %, the beta-W phase is changed into an alpha-W phase. This indicates that silicon (Si) stabilizes the beta phase in an initial step, but interferes with the formation of the beta-W phase as the content of silicon (Si) increases.

FIG. 34 illustrates thin film phases, obtained using an in-plane transmission electron microscope (TEM) of a thin film, dependent upon a silicon composition (0.0, 4.0, 9.1 at %) in the tungsten-silicon alloy layer of the W—Si/CoFeB/MgO/Ta structure according to Example 2 having PMA after performing vacuum thermal treatment at 300° C. for 1 hour, and FIG. 35 illustrates thin film phases, obtained using an in-plane transmission electron microscope (TEM) of a thin film, dependent upon a silicon composition (0.0, 4.0, 9.1 at %) of the tungsten-silicon alloy layer of the W—Si/CoFeB/MgO/Ta structure according to Example 2 having PMA after performing vacuum thermal treatment at 500° C. for 1 hour.

In FIGS. 34 and 35, the thickness of W—Si is 25 nm.

Referring to FIGS. 34 and 35, it can be confirmed that when the thickness is thick (e.g., 25 nm) or the thermal treatment temperature is 300° C. or higher, tungsten (W) prefers an alpha phase.

In addition, it can be confirmed that tungsten (W) is present in the form of an alpha phase in the first images of FIGS. 34 and 35 in which the content of silicon (Si) is 0 at %, a beta-W phase is exhibited although the thin film has a thick thickness of 25 nm as the content of silicon (Si) increases to 4.0 at %, and the beta-W phase is changed into an alpha-W phase again when the content of silicon (Si) is increased to 9.1 at %. This indicates that phase separation occurs.

In accordance with an embodiment of the present disclosure, a spin-orbit torque-based magnetic tunnel junction including a W—X alloy thin film having high spin-orbit coupling as a spin-orbit active layer, and thus, enabling spin-orbit torque switching and exhibiting high spin-orbit torque efficiency even at low specific resistance; and a method of fabricating the spin-orbit torque-based magnetic tunnel junction can be provided.

In accordance with an embodiment of the present disclosure, a spin-orbit torque-based magnetic tunnel junction in which X composition in a W—X alloy can be adjusted to control a switching current; and a method of fabricating the spin-orbit torque-based magnetic tunnel junction can be provided.

In accordance with an embodiment of the present disclosure, a spin-orbit torque-based magnetic tunnel junction including a tungsten-silicon alloy as a spin-orbit active layer, and thus, being capable of maintaining perpendicular magnetic anisotropy (PMA) in various thermal treatment temperature ranges; and a method of fabricating the spin-orbit torque-based magnetic tunnel junction can be provided.

Although the present disclosure has been described through limited examples and figures, the present disclosure is not intended to be limited to the examples. Those skilled in the art will appreciate that various modifications, additions and substitutions are possible, without departing from the scope and spirit of the disclosure. Therefore, it should be understood that there is no intent to limit the disclosure to the embodiments disclosed, rather, the disclosure is to cover all modifications, equivalents, and alternatives falling within the spirit and scope of the disclosure as defined by the claims.

| [Description of Symbols] |
| --- |
| 110: substrate |
| 120: spin-orbit active layer |
| 121: first conductive line |
| 122: second conductive line |
| 130: free layer |
| 140: tunnel barrier |
| 150: pinned layer |
| 160: capping layer |

What is claimed is:

1. A spin-orbit torque (SOT)-based magnetic tunnel junction, comprising:
    a spin-orbit active layer formed on the substrate;
    a free layer formed on the spin-orbit active layer;
    a tunnel barrier layer formed on the free layer; and
    a pinned layer formed on the tunnel barrier layer,
    wherein the spin-orbit active layer comprises a W—X alloy, where W is tungsten and X is selected from the group consisting of silicon (Si), tin (Sn), GaAs, GaP, InP, InGaAlN, and GaN).

2. The SOT-based magnetic tunnel junction according to claim 1, wherein the spin-orbit active layer is an electrode configured to provide an in-plane current in contact with the free layer.

3. The SOT-based magnetic tunnel junction according to claim 1, wherein a content of X comprised in the W—X alloy is 0.1 at % to 10.6 at %.

4. The SOT-based magnetic tunnel junction according to claim 1, wherein the spin-orbit active layer, the free layer, the tunnel barrier layer and the pinned layer has a cross shape in plan view.

5. The SOT-based magnetic tunnel junction according to claim 1, wherein the spin-orbit active layer has a cross shape in plan view, and
    the free layer, the tunnel barrier layer and the pinned layer are arranged in a form of an island in a center of the cross shaped-spin-orbit active layer.

6. The SOT-based magnetic tunnel junction according to claim 1, wherein a surface, which is in contact with the spin-orbit active layer, of the substrate comprises a native oxide layer.

7. The SOT-based magnetic tunnel junction according to claim 1, wherein a buffer layer is further comprised under the spin-orbit active layer.

8. The SOT-based magnetic tunnel junction according to claim 1, wherein a capping layer is further provided on the pinned layer of the spin-orbit torque-based magnetic tunnel junction.

9. A method of fabricating the spin-orbit torque-based magnetic tunnel junction of claim 1, the method comprising:
    forming the spin-orbit active layer on the substrate;
    forming the free layer on the spin-orbit active layer;
    forming the tunnel barrier layer on the free layer;
    forming the pinned layer on the tunnel barrier layer; and
    thermal-treating the free layer and the pinned layer to exhibit perpendicular magnetic anisotropy,
    wherein, in the forming of the spin-orbit active layer, W target and X target are simultaneously sputtered in a vacuum chamber such that a W—X alloy thin film (where W is tungsten and X comprises at least one of group IV semiconductors and group III-V semiconductors) is formed on the substrate disposed in the vacuum chamber.

10. The method according to claim 9, wherein a composition of the W—X alloy thin film is adjusted according to power of the W target and the X target.

11. The method according to claim 9, wherein a content of X comprised in the W—X alloy thin film is 0.1 at % to 10.6 at %.

12. The method according to claim 9, wherein a switching current is decreased as a temperature of the thermal-treating increases.

13. The method according to claim 9, wherein a temperature of the thermal-treating is 300° C. to 500° C.

14. The method according to claim 13, wherein a content of X comprised in the W—X alloy is adjusted according to the temperature of the thermal-treating.

15. The method according to claim 9, wherein the forming of the spin-orbit active layer further comprises patterning the W—X alloy thin film in a cross shape.

* * * * *